United States Patent
Hokari et al.

(10) Patent No.: US 7,145,792 B2
(45) Date of Patent: *Dec. 5, 2006

(54) SEMICONDUCTOR INTEGRATED CIRCUIT DEVICE

(75) Inventors: Tomofumi Hokari, Hamura (JP); Masatoshi Hasegawa, Hamura (JP); Yousuke Tanaka, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/211,543

(22) Filed: Aug. 26, 2005

(65) Prior Publication Data

US 2005/0281110 A1    Dec. 22, 2005

Related U.S. Application Data

(63) Continuation of application No. 10/860,770, filed on Jun. 4, 2004, now Pat. No. 6,954,371.

(30) Foreign Application Priority Data

Jul. 29, 2003    (JP)    ............................... 2003-281469

(51) Int. Cl.
*G11C 11/24*    (2006.01)
*G11C 7/00*    (2006.01)

(52) U.S. Cl. ....................... 365/149; 365/203; 365/210

(58) Field of Classification Search ................ 365/149, 365/203, 210

See application file for complete search history.

(56) References Cited

U.S. PATENT DOCUMENTS

| | | | |
|---|---|---|---|
| 6,052,324 A | 4/2000 | Tobita | 365/149 |
| 6,111,802 A | 8/2000 | Kano et al. | 365/203 |
| 6,594,187 B1 | 7/2003 | Ito | 365/203 |
| 6,687,152 B1 | 2/2004 | Ohsawa | 365/149 |
| 6,687,177 B1 | 2/2004 | Kurjanowicz | 365/210 |

FOREIGN PATENT DOCUMENTS

JP    11-39872    2/1999

*Primary Examiner*—Trong Phan
(74) *Attorney, Agent, or Firm*—Miles & Stockbridge P.C.

(57) ABSTRACT

The present invention provides a dynamic RAM which can be operated at a low voltage and realizes the enhancement of a read margin and an area-saving layout. In a memory array including a plurality of memory cells having capacitors which are formed corresponding to a plurality of word lines and a plurality of bit lines, stored information of the memory cell which is read to one bit line out of the pair of bit lines is sensed by a sense amplifier in response to a reference voltage which is formed by a dummy cell connected to another bit line, a precharge voltage of high level or low level corresponding to an operational voltage by a precharge circuit is supplied to the bit lines, and the dummy cells having the same structure as the memory cells are formed at crossing points of word lines for dummy cells and bit lines arranged outside the memory array, MOSFETs which precharge an intermediate voltage between the high level voltage and the low level voltage to the capacitors are provided, and gates of the MOSFETs are connected with charge word lines for dummy cells which are extended in parallel with the word lines for dummy cells.

9 Claims, 30 Drawing Sheets

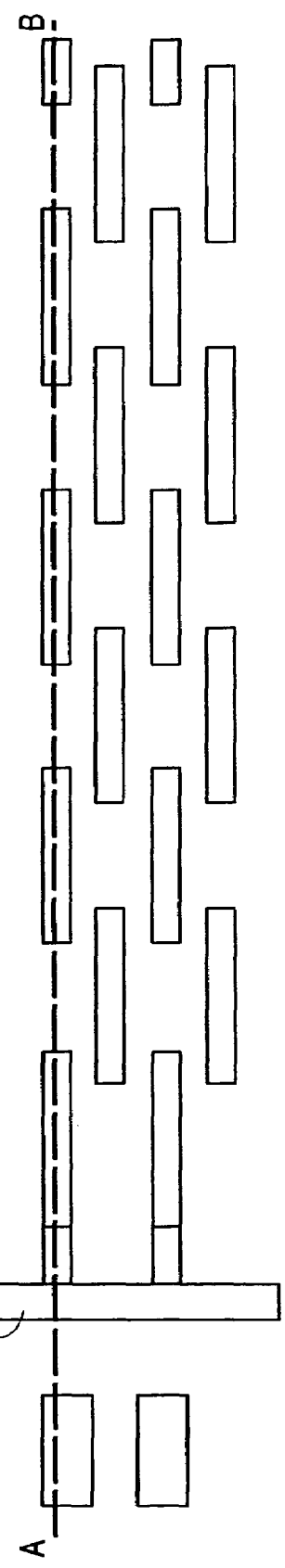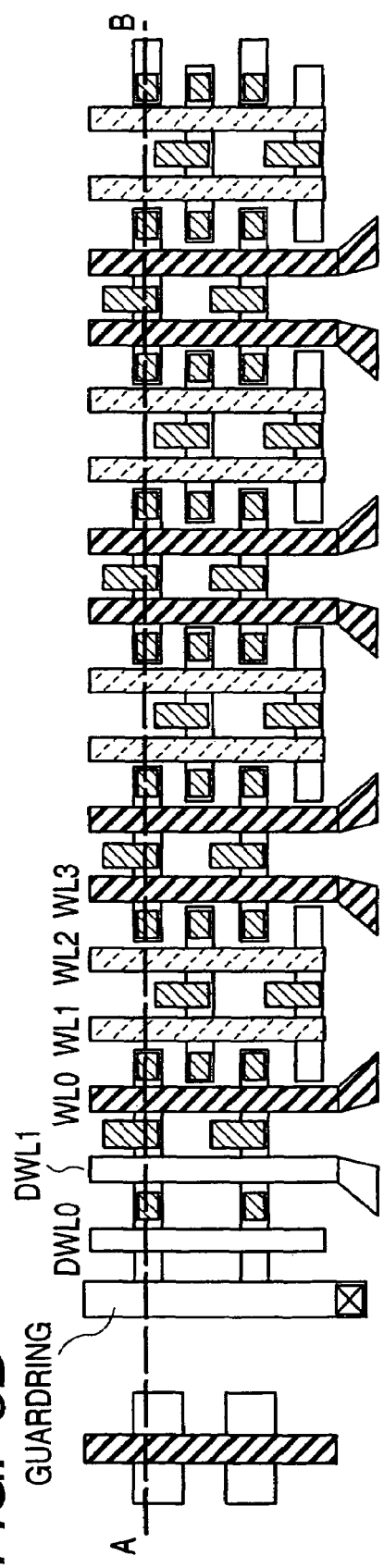
FIG. 5A
FIG. 5B (1) DURING DATA READ/WRITE (NORMAL MEMORY CELL)

(2) DURING DATA READ/WRITE (NORMAL MEMORY CELL)

FIG. 9
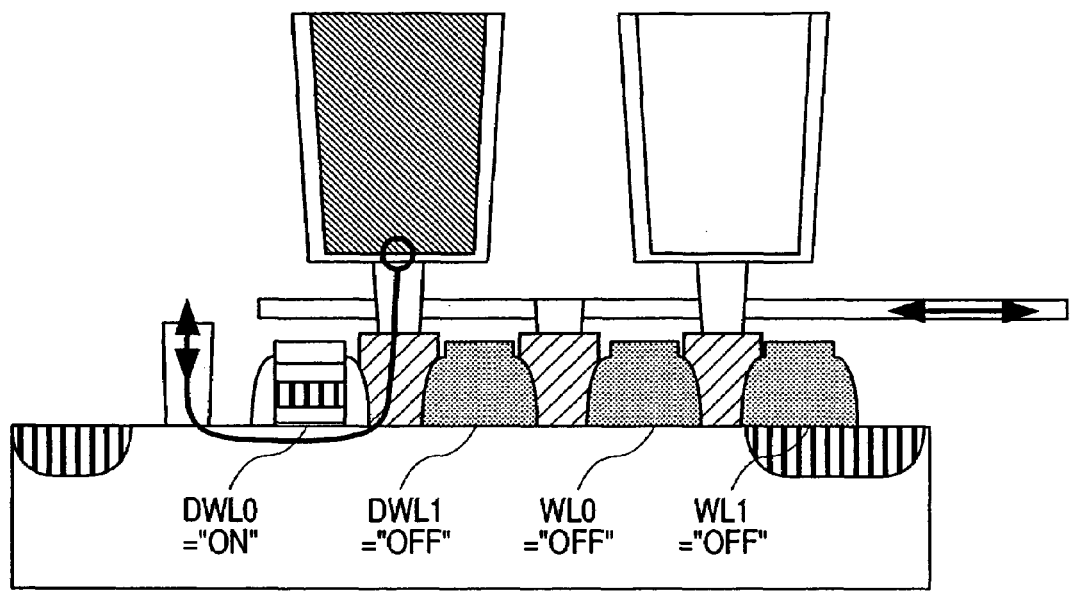
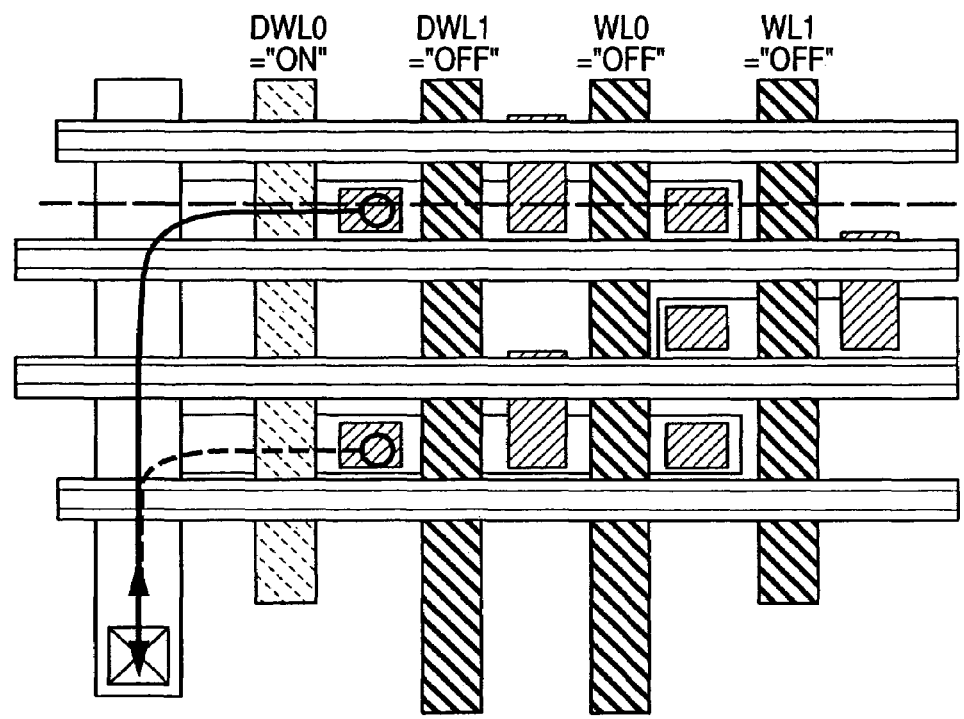
(3) DURING DUMMY CELL PRECHARGE

SEMICONDUCTOR INTEGRATED CIRCUIT DEVICE

CROSS-REFERENCE TO RELATED APPLICATION

This application is a continuation of application Ser. No. 10/860,770 filed Jun. 4, 2004 now U.S. Pat. No. 6,954,371.

CLAIM OF PRIORITY

The present application claims priority from Japanese application JP 2003-281469 filed on Jul. 29, 2003, the content of which is hereby incorporated by reference into this application.

FIELD OF THE INVENTION

The present invention relates to a semiconductor integrated circuit device and more particularly to a technique which is effectively applicable to a read circuit control technique of a dynamic random access memory (RAM) which uses charges of capacitors as stored information.

BACKGROUND OF THE INVENTION

In JP-A No. 039872/1999, there has been proposed a dynamic RAM which aims at rapid processing by increasing a voltage applied between a source and a drain of a differential MOSFET which precharges bit lines with a ground potential VSS of a circuit and constitutes a sense amplifier. In this publication, a capacitance value of capacitors of dummy cells is set to a half of a capacitance value of capacitors of normal memory cells thus forming a reference voltage supplied to the bit lines.

In such a dynamic RAM adopting the above-mentioned VSS precharge method, it is difficult to form the capacitance value of the dummy cell capacitors at ½ of a capacitance value of capacitors of the normal memory cells. Hence, there arises a drawback that a signal quantity difference is decreased due to process irregularities and a read margin of the sense amplifier is decreased. Further, it is also found that when a circuit having a different pattern than a pattern of the memory array is formed in a periphery of the memory array, the formability of a normal portion is deteriorated due to the coarseness and denseness of a layout pattern. The signal margin is also deteriorated.

In FIG. 1 and FIG. 2, a schematic circuit diagram of a dynamic RAM (hereinafter, simply referred to as a DRAM) which was studied in the course of arriving at the present invention is shown. FIG. 1 shows the DRAM adopting a VDD/2 precharge method and FIG. 2 shows the DRAM adopting a VSS precharge method as discussed in the above-mentioned publication. Although there is no specific limitation, the DRAMS shown in FIG. 1 and FIG. 2 adopt a fold-back bit line method (or a two crossing points method) in which a pair of complementary bit lines BLT, BLB extend in parallel with respect to a sense amplifier (V and SA, respectively). The DRAMS also adopt a shared sense amplifying method in which the sense amplifier is arranged between the above-mentioned pair of bit lines while the bit lines are respectively arranged on either side of the sense amplifier. In these drawings, the pair of bit lines BLT, BLB is illustrated as a representative example.

In FIG. 1 and FIG. 2, a precharge circuit is constituted of a MOSFETQ1 which is provided to input/output nodes of the sense amplifier SA and short-circuits the complementary bit lines BLT, BLB which are connected to each other by way of shared switches MOSFETQ4 and MOSFETQ5 (as illustrated in FIG. 1), and MOSFETQ2 and MOSFETQ3 which supply a precharge voltage based on the precharge activating signal to the bit lines BLT, BLB. In the VDD/2 precharge circuit, the precharge voltage VDD/2 is supplied through the above-mentioned MOSFETQ2 and MOSFETQ3. On the other hand, in the VSS precharge circuit shown in FIG. 2, the precharge voltage VSS is supplied through the above-mentioned MOSFETQ2 and MOSFETQ3. During a precharge period in which MOSFETQ1 and MOSFETQ3 assume an ON state, the above-mentioned shared switches MOSFETQ4 and MOSFETQ5 assume an ON state. Also with respect to the complementary bit lines at another side not shown in the drawing, the complementary bit lines are provided by way of a shared switch MOSFET having the substantially same constitution.

In the VDD/2 precharge method shown in FIG. 1, the bit lines BLT and BLB are normally held at a VDD/2 level during the precharge period. When a word line WL rises, information corresponding to a "0"/"1" stored in the memory cell is read to the bit line BLT as a minute signal quantity difference of $+/-\Delta V_{BL}$ with respect to VDD/2 which constitutes the center of the voltage range. Thereafter, when the sense amplifier SA commences operation, the signal quantity difference is compared with a potential of the bit line BLB and a "H"/"L" is judged using the VDD/2 level of the bit line BLB as the reference (the reference voltage).

On the other hand, in the VSS precharge method shown in FIG. 2, which includes gate line PE2, dummy word line DWL and VII, the bit lines are normally discharged to assume a VSS level during the precharge period. When the word line WL rises, although a normal memory cell charge is read to the bit line BLT, a bit line potential is not changed in case of "0" data. Accordingly, the potential (reference voltage) of the bit line BLB which is compared at the time of differential amplifying is required to assume an intermediate value which can obtain a minute read voltage $+/-\Delta V_{BL}$ corresponding to a binary value voltage which corresponds to the normal memory cell data of a "0"/"1".

In the above-mentioned patent application, the reference potential (reference voltage) is generated using dummy cells having a capacitance which is half of the capacitance of the normal memory cells. In the VSS precharge method, compared to the VDD/2 method, the extra number of elements becomes necessary by an amount corresponding to the dummy cells and a dummy cell control circuit and hence, it is difficult to make a layout which can constitute the circuit while suppressing an increase in area. Further, since a charge and a discharge of the bit line capacitance are conducted for every read cycle, compared to the VDD/2 precharge method which generates the precharge potential by redistributing the charge, power consumption is increased.

In view of the above, the conventional general-use DRAMS or the like have adopted the VDD/2 precharge method. However, recently, when the bit line voltage VDD, that is, an operational voltage of a sense amplifier is lowered along with miniaturization of the DRAMS, a drawback in terms of amplifying speed delay is expected to arise. This is because a source-drain voltage which is applied to both ends of the center amplifier becomes small at the time of amplifying. In the future, when the above-mentioned voltage VDD becomes 1.0 V or less, it is expected that a considerable time will be required for amplifying the initial minute signal difference $+/-\Delta V_{BL}$ which is read to the bit lines. To overcome this drawback, the inventors of the present invention have restudied the VSS precharge method to obtain a source-drain voltage twice as large as the source-drain voltage of the VDD/2 precharge method.

To realize the above-mentioned VSS precharge method, it is necessary to construct a circuit such that half of the normal memory cell charge is charged in the dummy cells. A VSS precharge circuit utilizes a Cs/2 memory cell to realize a method in which a capacitance value of the dummy cell is set to Cs/2, which is half of the normal memory cell potential and a charge of Cs×VDD/2 is stored in the dummy cells by charging with the bit line voltage VDD. In this method, it is difficult to form the dummy cells having a capacitance which is half of the memory cells and hence, there arises a drawback in that the read margin is lowered when a process becomes irregular. Further, it has been also found that when the circuit having a pattern different from the memory array is provided in a periphery of the memory array as mentioned above, the formability of the normal portion is deteriorated due to the coarseness and the fineness of the layout pattern and hence, the signal margin is further deteriorated.

Accordingly, the inventors of the present invention have considered a usual memory-cell-use type VSS precharge circuit, that is, a method which sets the dummy cell capacitance to Cs which is equal to the capacitance of the normal memory cell and performs charging using the VDD/2 level voltage. By adopting this method, as the dummy cells, it is possible to use the memory cell which is equal to the memory cell used as the normal memory cells and hence, the dummy cells can be formed by a substantially equal fabrication process. At the same time, the degree of irregularities becomes substantially equal between the normal memory cells and the dummy cells. Thereby, the fabrication margin is enhanced. However, to supply the charge of Cs×VDD/2 to the dummy cells, it is necessary either to charge VDD/2 to the inside of the dummy cells through the bit lines BLB, BLT, or to add a special circuit for charging the dummy cells. When the charging is performed through the bit lines, a resistance value is large and hence, a charging time is increased and the merit of adopting the VSS precharge method is decreased. Hence, it is necessary to construct a circuit such that the charge is directly supplied to storage nodes of the capacitors of the dummy cells.

To add such a circuit, it is necessary to layout the dummy cells apart from the memory array having a narrow pitch and hence, a peripheral pattern becomes coarse whereby there exists a possibility that cell shape is changed. In this manner, it has been found that, in such a memory array, the formability of the normal portion is deteriorated due to the coarseness and fineness of the layout pattern and the construction which makes the degree of irregularities substantially equal between normal cells and the dummy cells is not utilized and the signal margin is further deteriorated. That is, the reduction of the forming irregularities which is the advantageous effect obtained by making the capacitance of the dummy cells to Cs which is also the capacitance of the normal memory cells is lost. Hence, eventually, there arises the displacement in the reference potential attributed to the charge supplied to the dummy cells whereby the read margin at the time of performing the sensing operation is decreased.

SUMMARY OF THE INVENTION

It is an object of the present invention to provide a semiconductor integrated circuit device having a dynamic RAM which can perform a low-power voltage operation and, at the same time, can realize the enhancement of a read margin and a space saving layout. The above-mentioned object, other objects and novel features of the present invention will become apparent from the description of this specification and attached drawings.

In an exemplary embodiment of the invention, a memory array includes a plurality of memory cells having stack-type capacitors which are formed corresponding to a plurality of word lines and a plurality of bit lines. Stored information in the memory cell is read to one bit line out of the pair of bit lines and is sensed and amplified by a sense amplifier in response to a reference voltage. The reference voltage is formed by a dummy cell connected to another bit line, and a precharge voltage of high level or low level corresponding to an operational voltage of the sense amplifier is supplied to the bit lines by a precharge circuit. The dummy cells having the same structure as the memory cells are formed at crossing points of dummy cell word lines and bit lines that are provided outside the memory array. MOSFETs which precharge an intermediate voltage between the high level voltage and the low level voltage are provided to capacitors of the dummy cells, and gates of the MOSFETs are connected with charge dummy cell word lines which are extended in parallel with the dummy cell word lines.

Due to such a constitution, even at a low voltage, it is possible to enhance the read margin thus leading to the realization of rapid processing and a space saving layout.

BRIEF DESCRIPTION OF THE DRAWINGS

FIG. 5A and FIG. 5B are representative partial layout views showing one embodiment of the memory array part of a DRAM according to the present invention;

FIG. 9 is an explanatory view of a dummy cell precharging operation in the memory array part of the DRAM according to the present invention;

DETAILED DESCRIPTION OF THE PREFERRED EMBODIMENTS

Figure 3:
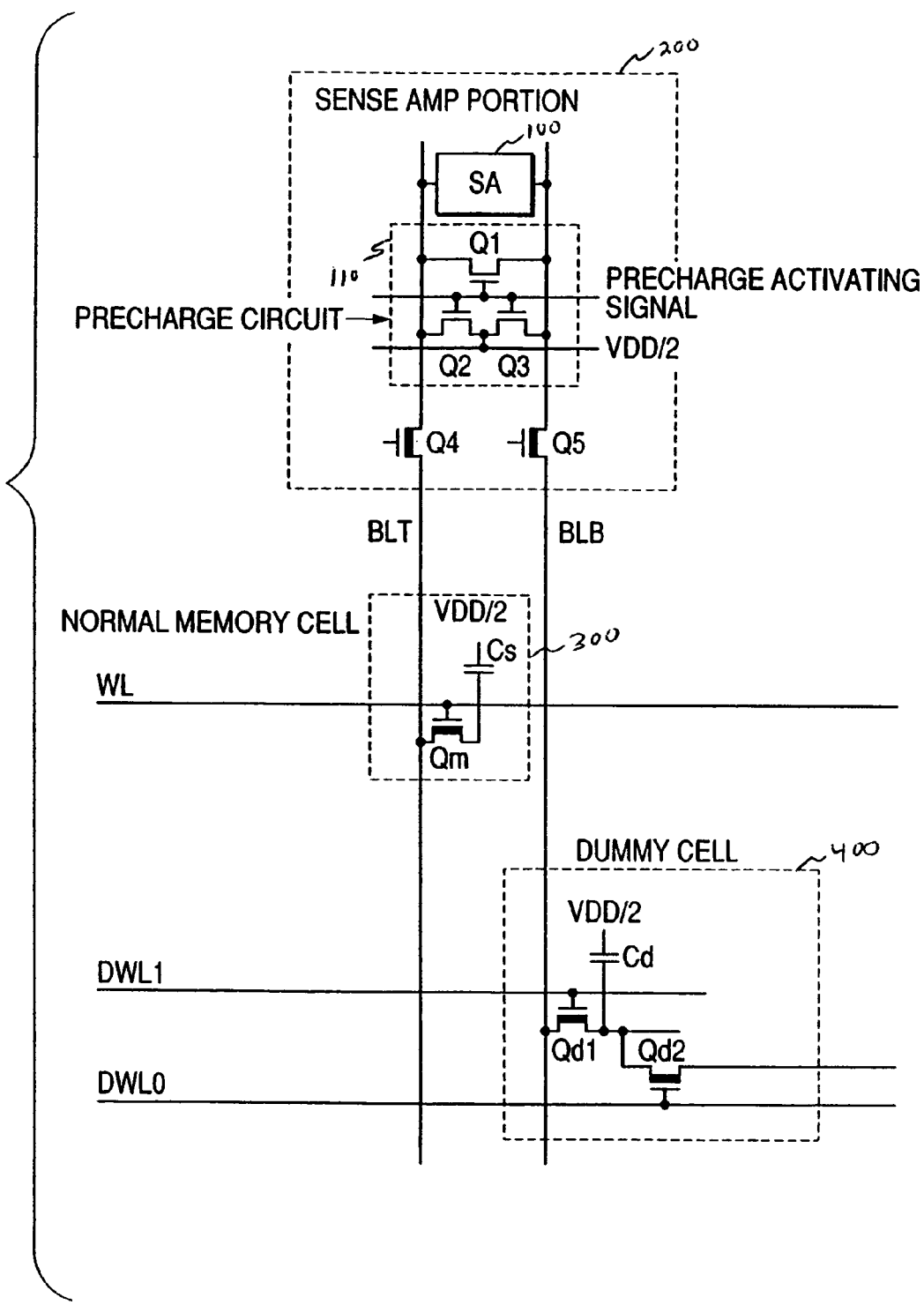
FIG. 3 is a schematic circuit diagram showing one embodiment of a memory array part of a DRAM according to the present invention.

FIG. 3 shows a schematic circuit diagram of one embodiment of a memory array part of a DRAM according to the present invention. Although not specifically limiting, this embodiment is directed to a DRAM which adopts a foldback bit line method (or a two crossing-point method) in which a pair of complementary bit lines BLT, BLB extend in parallel with respect to a sense amplifier SA 100. The exemplary embodiment also adopts a shared sense amplifying method in which the sense amplifier SA is arranged between the pair of bit lines BLT, BLB. In these drawings, the sense amplifier portion 200 and a memory array part which correspond to complementary lines on one side are illustrated. The memory array part includes, as a representative example, a pair of complementary bit lines BLT, BLB, a normal word line, two dummy word lines DWL0, DWL1, one normal memory cell which is formed at a crossing portion between the normal word line and the bit line BLT, and one dummy cell which is formed at a crossing portion between the dummy word line DWL1 and the bit line BLB.

The sense amplifier portion 200 is constituted of the sense amplifier SA 100 indicated by a black box, a precharge circuit 110 and a shared switch. The precharge circuit is, in the same manner as the circuit shown in FIG. 2, constituted of a MOSFETQ1 which short-circuits the complementary bit lines BLT, BLB which are provided to input and output nodes of the sensor amplifier SA and are connected with each other by way of shared switches MOSFETQ4 and MOSFETQ5, and a MOSFETQ2 and a MOSFETQ3 which supply a precharge voltage based on the precharge activating signal to the above-mentioned bit lines BLT, BLB. The MOSFETQ2 and the MOSFETQ3 are provided for supplying a precharge voltage VSS. During a precharge period in which MOSFETQ1 to MOSFETQ3 assume an ON state, the shared switches MOSFETQ4 and MOSFETQ5 assume an ON state. Also with respect to other complementary bit lines not shown in the drawing, complementary bit lines are formed by way of the above-mentioned similar shared switch MOSFETs.

The normal memory cell 300 comprises an address selection MOSFETQm and a storage capacitor Cs. A gate of the address selection MOSFETQm is connected with the normal word line WL. A source and a drain of the address selection MOSFETQm at one side are connected to the bit line BLT, and a source and a drain of the address selection MOSFETQm at another side are connected with a storage node which constitutes one electrode of the capacitor Cs. The other electrode of the capacitor Cs is formed into a common plate with another capacitor and another electrode and, although not specifically limited, an intermediate potential VDD/2 between "H"/"L" data stored in the memory cell is given to another electrode of the capacitor Cs.

The dummy cell 400 comprises a selective MOSFETQd1 and a capacitor Cd having the substantially same constitution as the above-mentioned normal memory cell and, in addition, a capacitor charging MOSFETQd2. A gate of the FETQd1 is connected with the dummy word line DWL1 and a source of the MOSFETQd1 is connected with the bit line BLB and a drain of the MOSFETQd1 is connected with a storage node which constitutes one electrode of the capacitor Cd. The other electrode of the capacitor Cd is formed into a plate which is formed in common with the capacitor Cs. A gate of the MOSFETQd2 is connected with the dummy word line DWL0 and a drain of the MOSFETQd2 is connected with the storage node which constitutes one electrode of the capacitor Cd and a voltage such as VDD/2 is supplied to a source of the MOSFETQd2.

Figure 4:
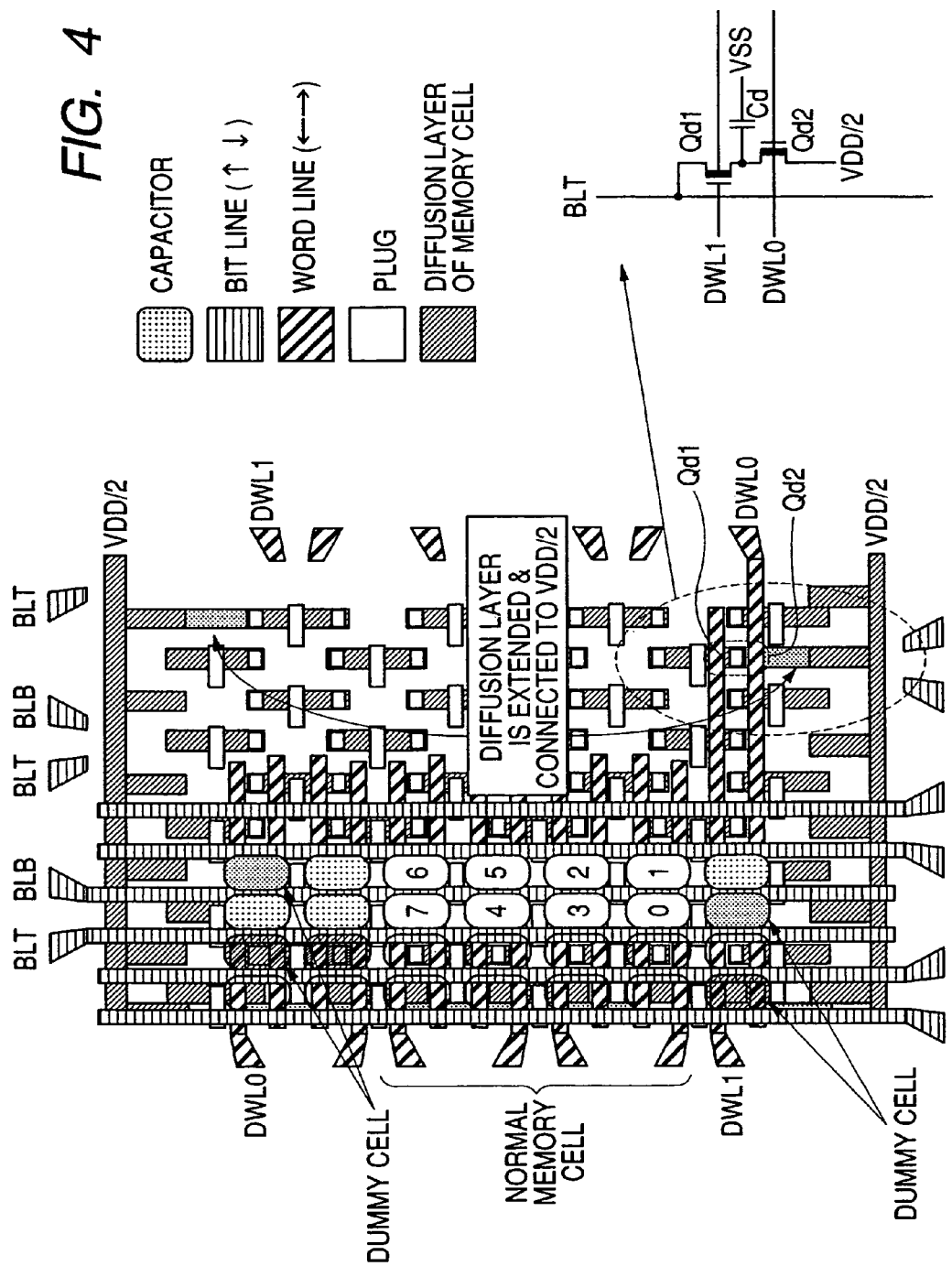
FIG. 4 is a view showing one embodiment of the memory array part of a DRAM according to the present invention.

FIG. 4 illustrates one embodiment of the memory array part of the DRAM according to the present invention. In particular, this view shows a schematic layout of the respective elements and lines in FIG. 3, wherein the capacitors, the bit lines, the word lines, the plugs and memory diffusion layers are illustrated. To facilitate the understanding the arrangement of the above-mentioned respective layers, the bit lines, the capacitors and the word lines are partially omitted and only plugs which connect between the diffusion layers of memory cells (0–7) and plugs which connect between layers are shown.

As the MOSFETQd2 for charging the dummy capacitor Cd, a MOSFET which corresponds to an address selection (transfer) MOSFETQm in the inside of the memory array is used. Charging and discharging of the dummy cell are configured to be controlled through the above-mentioned dummy word lines DWL0, DWL1. To realize such a circuit, using memory cells arranged at the outer periphery of the memory cells as dummy cells, as shown in the drawing, diffusion layers thereof are extended in the guard-ring directions arranged in outer peripheries thereof. The extended diffusion layers extend beyond the word line DWL0 which constitutes a dummy cell charging switch and are connected with the guard ring to which a potential of VDD/2 is supplied.

At the time of charging the dummy cell, the dummy cell word lines DWL1 are set to a non-selective level so as to turn off the MOSFETQd1, and the charge dummy cell word lines DWL0 are set to a selective level so as to turn on the MOSFETQd2. Hence, the capacitor Cd of the dummy cell is charged with VDD/2. On the other hand, at the time of reading the charge of the capacitor Cd of the dummy cell to the bit line BLB, the dummy cell word lines DWL1 are set to a selective level so as to turn on the MOSFETQd1, and the dummy cell charge word lines DWL0 are set to a non-selective level so as to turn off the MOSFETQd2. Hence, the charge of the dummy cell can be read to the bit line BLB.

The dummy cell charging circuit comprising the MOSFETQd2 and the dummy word line DWL0 is formed of a transfer MOSFET which uses a word line in accordance with a memory cell pitch. Due to such a constitution, it is possible to arrange the dummy cells continuously with the normal memory cells whereby the capacitive difference between the dummy cell and the normal memory cell attributed to the process irregularities can be eliminated. Further, it is sufficient to add a single word line (the above-mentioned DWL0) and to extend the diffusion layers and hence, it is unnecessary to add new elements thereby conserving area.

Figures 6A, 6B:
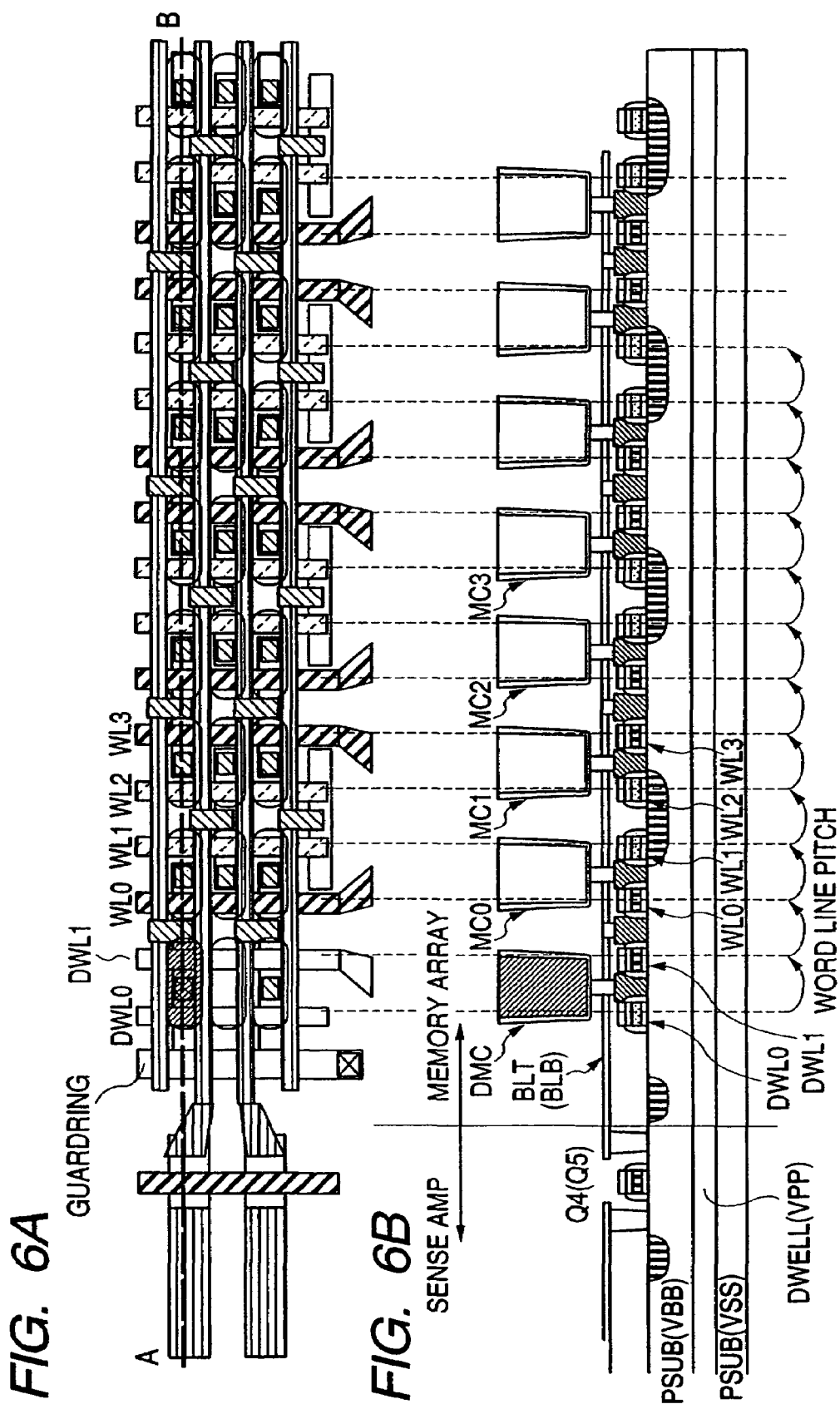
FIG. 6A and FIG. 6B are other representative partial layout views showing one embodiment of the memory array part of the DRAM according to the present invention.

FIG. 5A and FIG. 5B as well as FIGS. 6A and 6B show layouts for respective representative layers of one embodiment of the memory array part of the DRAM according to the present invention. In these drawings, FIG. 5A shows the layout of the diffusion layers and FIG. 5B shows the layout of the word line/gate layer, while FIG. 6A shows the layout of the bit line layers/capacitors and FIG. 6B show the cross-sectional structure taken along plane A-B of FIGS. 5A, 5B and 6A. In FIG. 6B, memory cells MC0–MC3 are illustrated as well as dummy memory cell DMC, voltages PSUB(VBB), PSUB(VSS), and DWELL (VPP). The word LINE PITCH is also illustrated.

In this embodiment, as shown in FIG. 5A, it is sufficient to change only the diffusion layers and to connect the diffusion layers to the guard rings to which VDD/2 is supplied. Due to such a constitution, the transfer MOSFET below the word line DWL0 at the outermost periphery of the memory array constitutes the dummy cell charging circuit. That is, the word line DWL0 is used as the dummy cell charging signal line and the transfer MOSFET formed below the word line DWL0 is used as the charging MOSFETQd2. A stack type capacitor is used as the capacitor as shown in FIGS. 6A and 6B.

Figure 7:
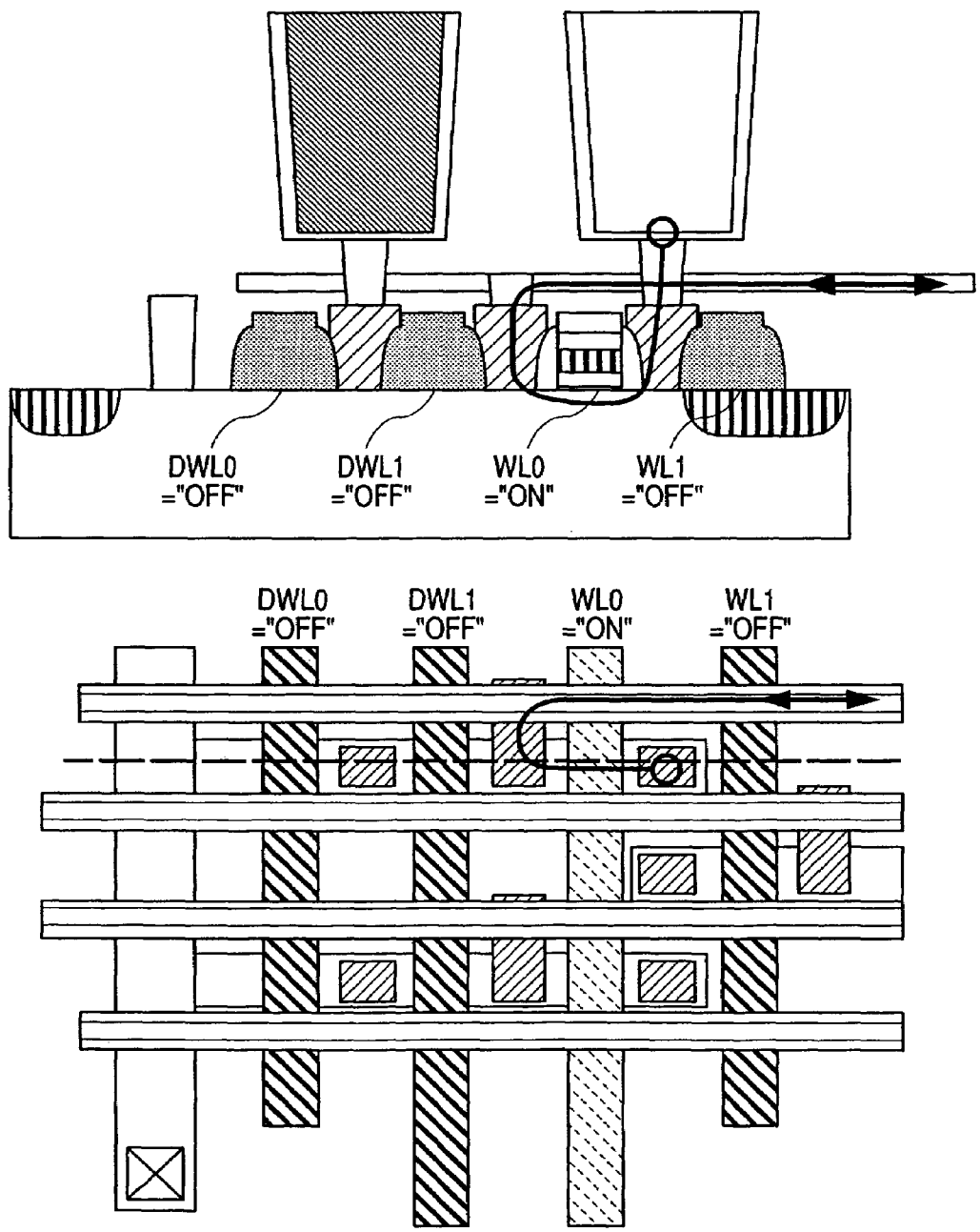
FIG. 7 is an explanatory view of an operation of a normal memory cell at the time of performing a data read/write operation in the memory array part of the DRAM according to the present invention.

FIG. 7 is an explanatory view of an operation of the normal memory cells at the time of performing data read/write in the memory array part of the DRAM according to the present invention. In the drawing, the cross-sectional structure and the layout corresponding to the cross-sectional structure are shown. The state at the time of performing data reading/writing in the drawing is substantially the same as a corresponding state of a usual memory cell. That is, the word line WL0 is set to a selective level ("ON"). DWL0, DWL1 and WL1 are set to ("OFF") in this state. Hence, the transfer MOSFET for address selection assumes an ON state, wherein the bit line and the capacitor are connected with each other so as to supply the charge to the bit line at the time of reading, and the charge in accordance with the potential of the bit line is stored at the time of writing.

Figure 8:
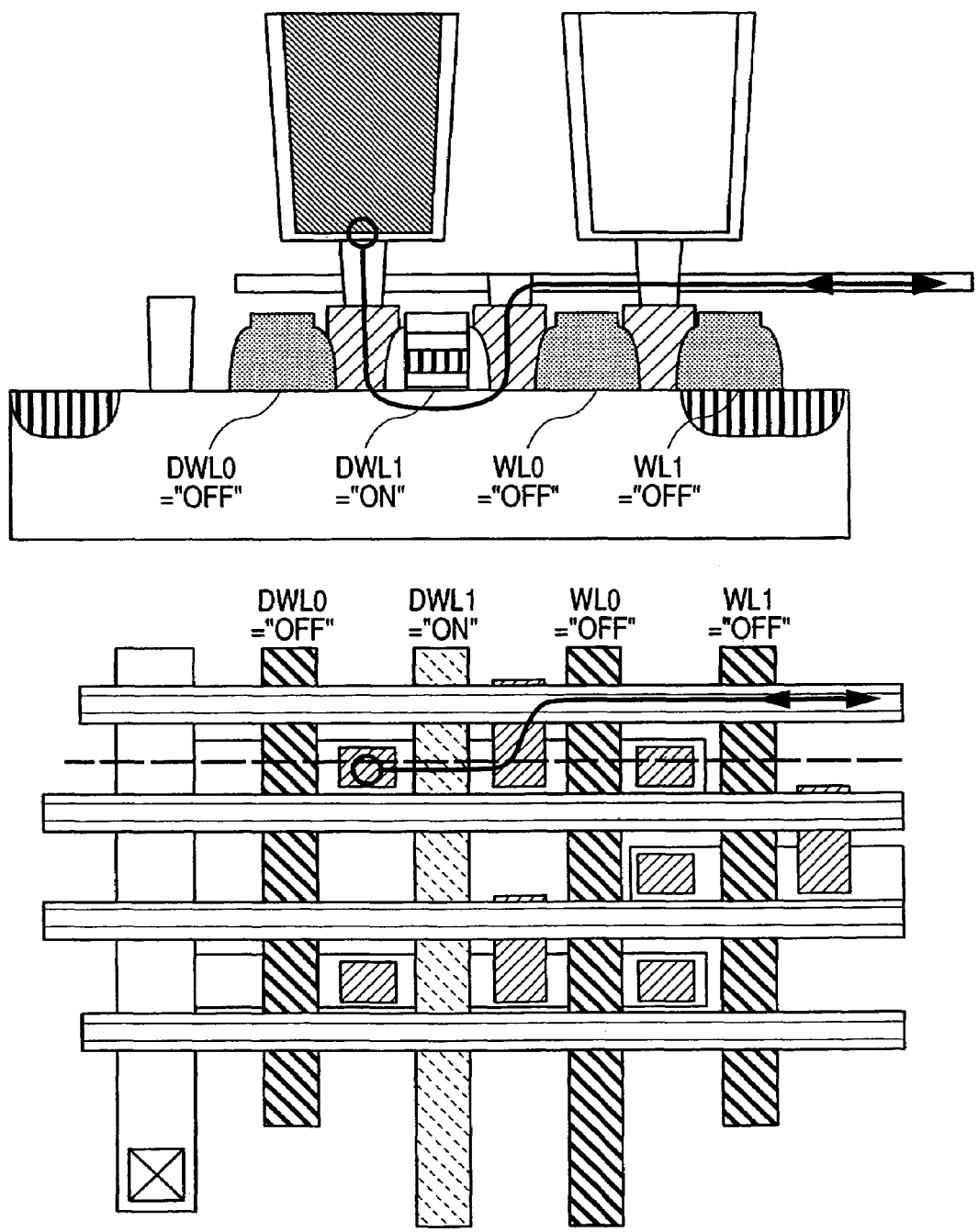
FIG. 8 is an explanatory view of an operation of a dummy cell at the time of performing a data read/write operation in the memory array part of the DRAM according to the present invention.

FIG. 8 is an explanatory view of an operation of the dummy memory cells at the time of performing data reading/writing in the memory array part of the DRAM according to the present invention. In the drawing, in the same manner as FIG. 7, the cross-sectional structure and the layout corresponding to the cross-sectional structure are shown. As shown in the drawing, when the bit line is provided at the reference side, the dummy cell word line DWL1 is set to the selective level ("ON") with DWL0, WL0 and WL1 being set to ("OFF") and the charge of the capacitor in the inside of the dummy cell is read to the bit lines. Although the charge which conforms to VDD or VSS is eventually stored in the dummy cell capacitor, at the time of performing reading/writing in response to an amplifying operation of the sense amplifier, this charging per se has no significance and is replaced with the precharge charge in the next dummy cell precharge operation.

FIG. 9 is an explanatory view of a precharge operation of the dummy memory cells in the memory array part of the DRAM according to the present invention. In the drawing, in the same manner as FIG. 7 and FIG. 8, the cross-sectional structure and the layout corresponding to the cross-sectional structure are shown. Upon completion of the reading/writing operation in FIG. 7 and FIG. 8, the dummy cell charge word line DWL0, which is arranged at a side opposite to the dummy cell word line DWL1, with the memory cell sandwiched therebetween, is set to the selective level ("ON") with DWL1, WL0 and WL1 being set to ("OFF") and the capacitor of the dummy cell is charged with the VDD/2 level of the guard ring portion.

Figure 10:
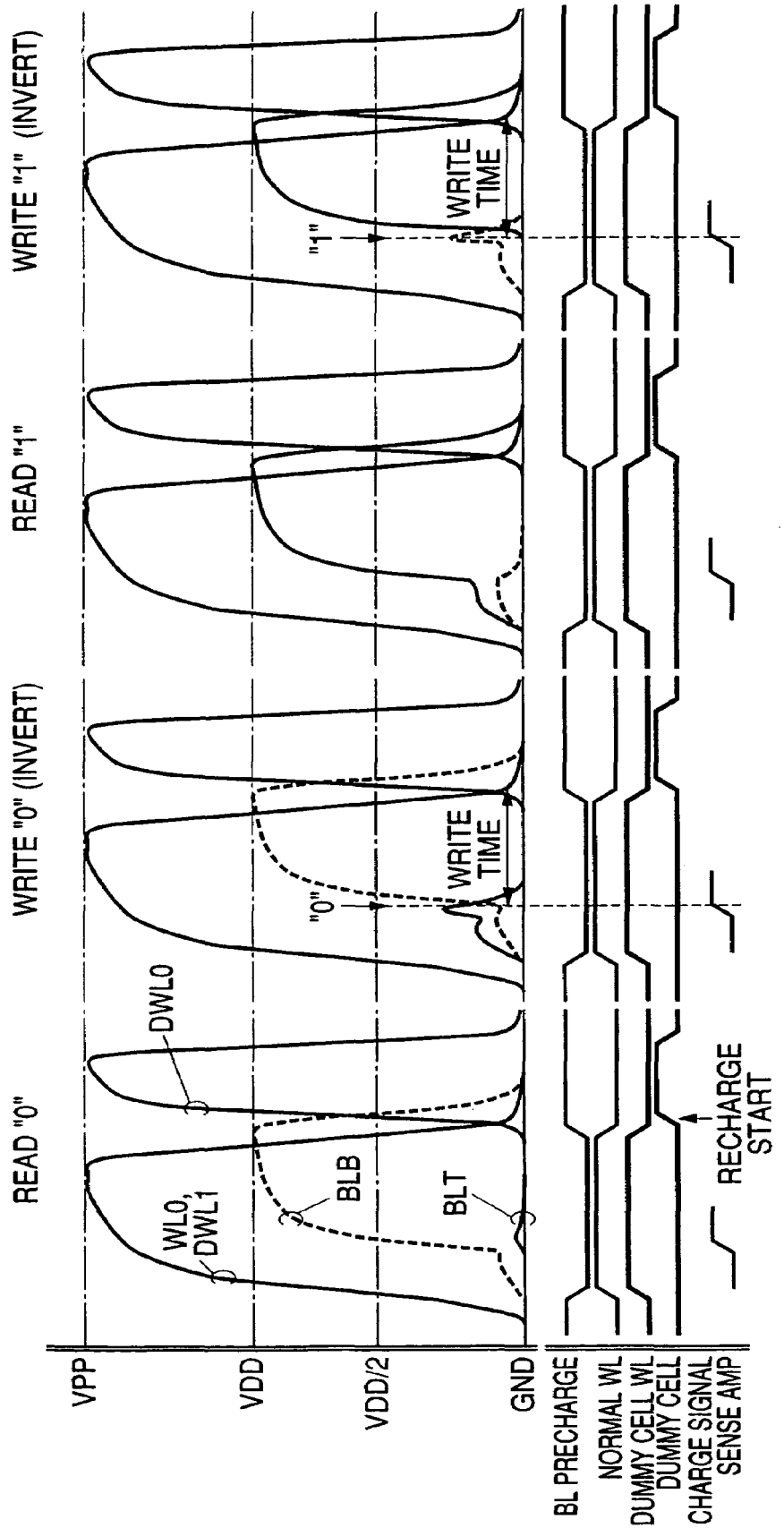
FIG. 10 is a waveform chart for explaining one example of the operation of the DRAM according to the present invention.
Figure 11:
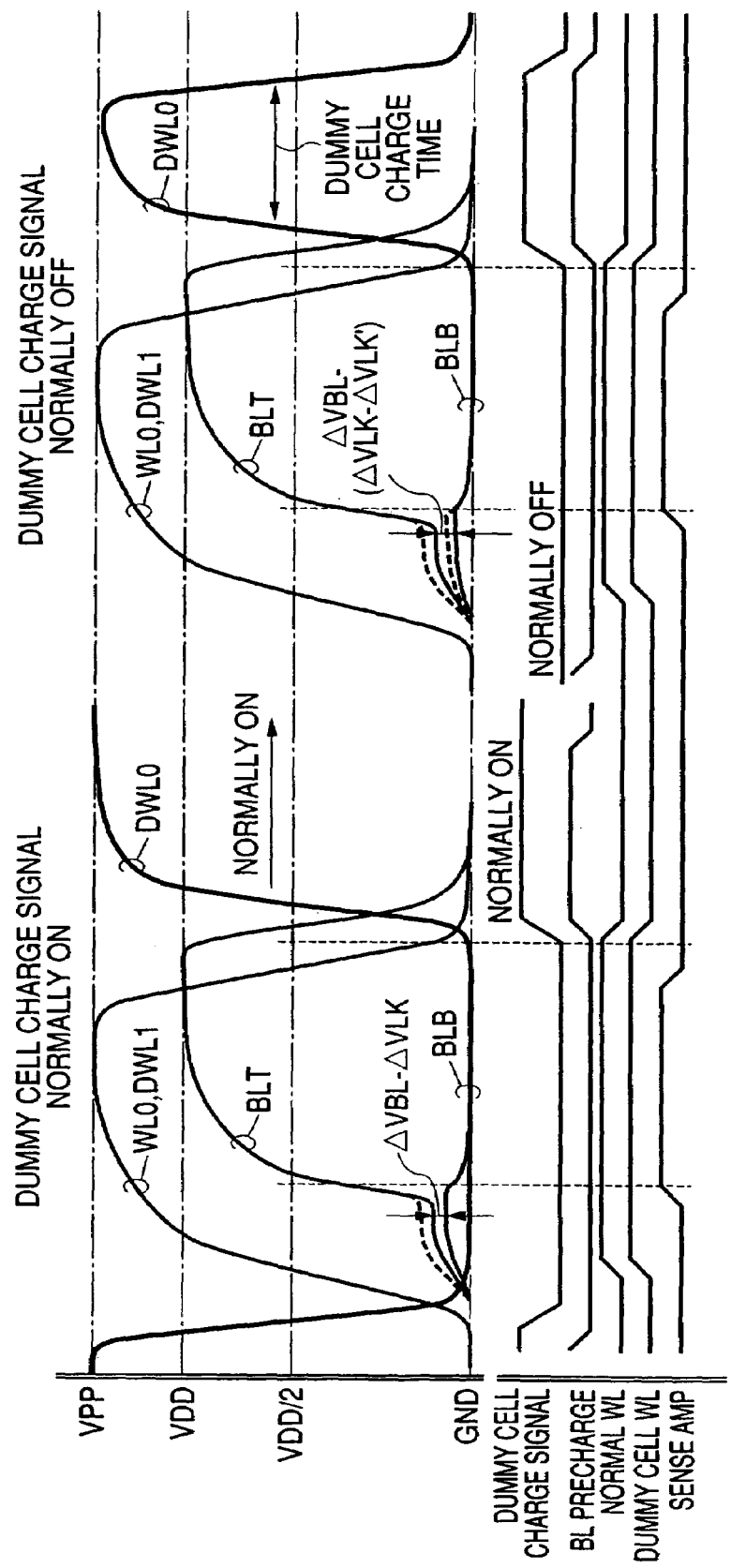
FIG. 11 is a waveform chart for explaining one example of the dummy cell charging operation according to the present invention.

FIGS. 10 and 11 show a waveform chart for explaining one example of an operation of the DRAM according to the present invention. The charts, in FIGS. 10 and 11 illustrated the operation of the DRAM in relation to signals GND, BL PRECHARGE, NORMAL WL, DUMMY CELL WL, DUMMY CELL CHARGE SIGNAL and SENSE AMP. In the drawing, the example in which read "0", write "0" (INVERT), read "1", write "1" (INVERT) are repeated is shown. When the specific address is selected and the corresponding word line WL of normal memory cell rises, dummy cell word line DWL1 which is connected with the bit line which becomes the reference also rises. A potential which corresponds to the signal in the inside of the memory cell is read to the normal-memory-cell-side bit line BLT (or BLB) and the dummy-cell-side bit line BLB (or BLT) assumes the reference potential. Thereafter, when the sense amplifier is turned on, the magnitude of the minute voltage between the bit lines BLT, BLB is judged and amplification is performed based on the judgment. When the word line WL is turned off upon completion of the reading/writing (WRITETIME) operation, it is necessary to recharge (RECHARGE START) the dummy cell with VDD/2 for the next cycle. Accordingly, the dummy cell charging word line DWL0 is turned on (selective level) and the VDD/2 is supplied from the guard ring portion.

That is, in read "0", the VSS which corresponds to the signal charge in the inside of the memory cell is read to the bit line BLT (or BLB) at a normal memory cell side and, in the above-mentioned manner, the magnitude of the minute voltage between the bit lines BLT, BLB is judged and amplification is performed based on the judgment. Accordingly, the above-mentioned bit line BLT (or BLB) at a normal memory cell side is set to VSS and the bit line BLB (or BLT) at a dummy cell side is set to VDD. In write "0" (INVERT), although the above-mentioned bit line BLT at a normal memory cell side is set to a voltage higher than the reference potential of the bit line BLB (or BLT) at a dummy cell side, in accordance with an amplifying output of the sense amplifier corresponding to write "0", the bit line BLT at a normal memory cell side is set to VSS corresponding to the write data. Here, although the storage node of the dummy cell which is connected with the bit line BLB (or BLT) at a dummy cell side is set to VDD, in accordance with the amplifying output of the sense amplifier SA, the storage node of the dummy cell is precharged with VDD/2 due to the dummy cell precharging operation.

In read "1", the above-mentioned bit line BLT (or BLB) at a normal memory cell side is set to a voltage higher than the reference potential corresponding to the signal charge in the inside of the memory cell and is set to a high level corresponding to VDD amplified by the sense amplifier. In write "1" (INVERT), although the above-mentioned bit line BLT at a normal memory cell side is set to a voltage lower than the reference potential of the bit line BLB (or BLT) at a dummy cell side, in accordance with an amplifying output of the sense amplifier corresponding to write "1", the bit line BLT at a normal memory cell side is set to VDD corresponding to write data. Although the storage node of the dummy cell which is connected with the bit line BLB (or BLT) at a dummy cell side brings, in response to turning on of the above-mentioned dummy word line DWL1, the potential of the bit line to the above-mentioned reference potential, the storage node of the dummy cell is set to a level which is complementary with the above-mentioned bit line BLT (or BLB) at a normal memory cell side due to the amplifying operation of the sense amplifier and is precharged with VDD/2 by the dummy-cell precharging operation performed thereafter. In parallel with the above-mentioned dummy cell precharging operation, the bit lines BLT, BLB are precharged with the precharge signal.

FIG. 11 shows a waveform chart of the dummy cell charging operation according to the present invention. In the drawing, two kinds of charging operations are shown. One charging operation is an operation which makes the dummy cell charging signal normally assume an ON state and another charging operation is an operation which makes the dummy cell charging signal normally assume an OFF state. In the charging operation (DUMMY CELL CHARGE TIME) which makes the dummy cell charging signal normally assume an ON state, when the word lines WL, DWL1 for the normal memory cell/dummy memory cell fall, the word line DWL0 for dummy cell charging rises and charging of the dummy cell is started. In the charging operation which makes the dummy cell charging signal normally assume an ON state, by holding the charging word line DWL0 in an ON state even after the completion of charging (VDD/2) in the inside of the dummy cell, it is possible to hold the inside of the dummy cell at VDD/2. However, at this point of time, since the holding potential of the capacitor Cs of the normal memory cell is gradually lowered due to leaking thereof, the minute signal quantity difference is decreased as shown in FIG. 11 ($\Delta$VBL-$\Delta$VLK).

Accordingly, the operation which makes the dummy cell charging signal normally assume an OFF state is designed to have a specification that when charging of the dummy cell is completed in the same manner as the above-mentioned operation, the charge word lines for dummy cells DWL0 rises. Due to such a constitution, corresponding to lowering of potential attributed to leaking ($\Delta$VLK) of the capacitor Cs in the inside of the memory cell, the charge of the capacitor Cs in the inside of the dummy cell which generates the reference potential is made to leak ($\Delta$VLK') thus increasing the signal quantity as expressed by $\Delta$VBL-($\Delta$VLK-$\Delta$VLK'). Thus, the read margin can be enhanced.

Figure 12:
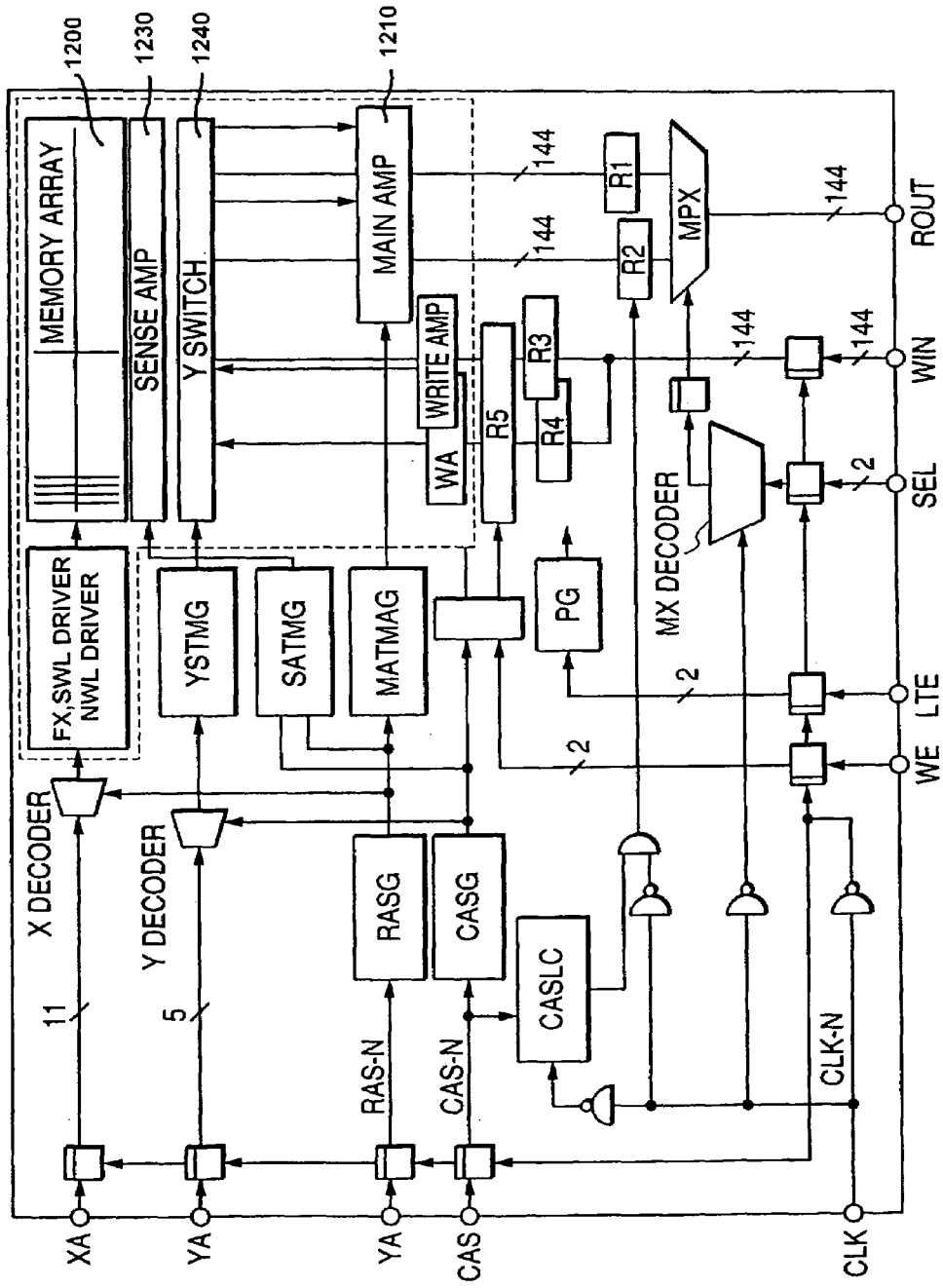
FIG. 12 is a block diagram showing one embodiment of a DRAM macro according to the present invention.

FIG. 12 shows a block diagram of one embodiment of a DRAM macro to which the present invention is applied. The DRAM macro of this embodiment is directed to a so-called mixed-loaded DRAM and forms one LSI together with a peripheral circuit not shown in the drawing which controls the DRAM macro. The DRAM macro includes in addition to the elements discussed below inputs WE, LTE and SEL as well as elements PG and MX DECODER. Although the LSI is not specifically limiting, the LSI is used as a cache memory. An external interface of the LSI includes an interface block corresponding to the processor and an interface block corresponding to the memory, wherein a write buffer, a read buffer and a multiplexer are provided corresponding to these two interface blocks. Further, although not specifically limiting, the above-mentioned write buffer and the read buffer are constituted of a static type RAM, while the multiplexer or the like is constituted of a logic circuit formed of a gate array, or the like.

To roughly explain the operation of the DRAM macro shown in the drawing, data in 288 bit units are read from the memory array 1200 through the main amplifier 1210 and the data is stored in registers R1, R2 in 144 bit units. Then, one register is selected by the multiplexer (MPX) and the data is output to the read buffer (not shown) via ROUT provided outside the above-mentioned DRAM macro. The write data in 144 bit units are input to the DRAM macro from the write buffer (not shown) via WIN provided outside the DRAM macro and are held in the registers R3, R4 correspondingly. In the write amplifier WA, the read data in 288 bit units are held in a register RS and are selectively replaced with the data in 144 bit units held in the registers R3, R4. At the time of performing the writing operation, while the data in 288 bit units held in the register R5 are written in the memory array all together through the write amplifier (WRITE AMP), it is possible to rewrite with the data in 144 bit units using the registers R3, R4. This DRAM macro is substantially equal to a usual DRAM macro except for the constitution that the word lines and dummy word lines are selected in response to signals from an RAS address.

For selection of the memory array, an X address XA is input to the X DECODER in synchronism with a RAS signal (RAS-N) and a Y address YA is fetched in synchronism with a CAS signal (CAS-N). A clock CLK is provided for performing inner operations in synchronism with the clock CLK and CLK-N. The above-mentioned DRAM memory array adopts a hierarchical word line method and includes, for selecting the word lines of the memory array and a main word line selection circuit (MWL driver), sub word line selection circuits (FX, SWL drivers) as a word line selection circuit. For such a memory array, the above-mentioned sense amplifier 1230 and a Y switch 1240 are provided. For operating these selection circuits, a row-system timing control circuit RASG, a column-system timing control circuit CASG, a CAS latency control circuit CASLC, a Y switch timing circuit YSTMG, a sense amplifier timing circuit SATMG, a main amplifier timing circuit MATMG and the like are provided.

The allocation of the X address in the DRAM macro is executed as follows. Although not specifically limiting, the X address is constituted of 11 bits ranging from X0 to X10, wherein 4 bits ranging from X10 to X7 are served for forming mat selection signals MS0 to MS15. X6 to X0 are served for selecting word lines of respective memory mats, wherein 4 bits ranging from X6 to X3 are served for the main word lines. X2 to X0 are served for FX selection, that is, for selecting 8 sub word lines which are allocated to one main word line.

Figure 13:
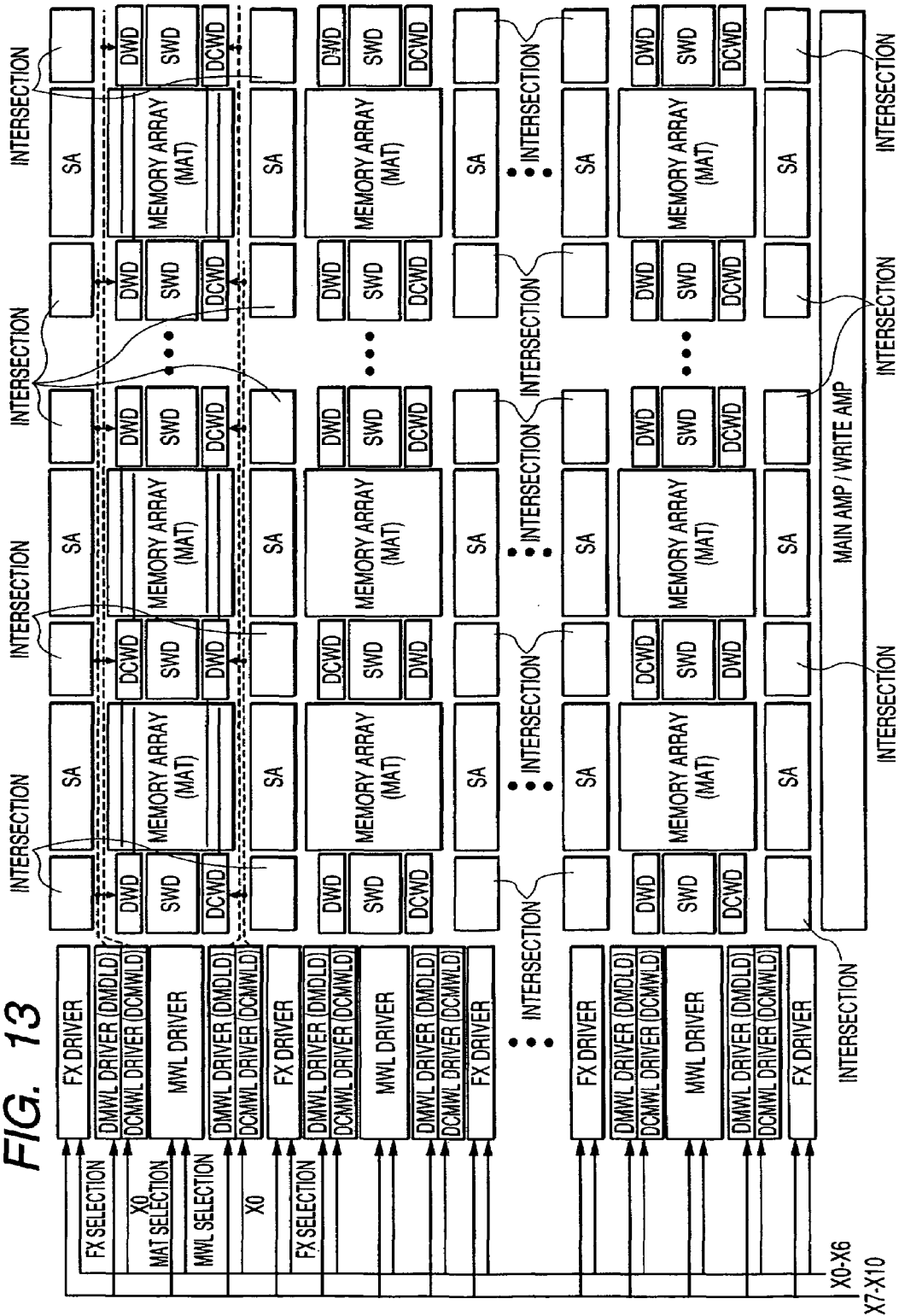
FIG. 13 is a schematic layout view showing one embodiment of a memory array of the DRAM macro according to the present invention.

FIG. 13 shows a schematic layout of one embodiment of the memory array of the DRAM macro according to the present invention. The memory array comprises a plurality of memory arrays (memory mats) which are divided in the word line direction and the bit line direction, respectively. The divided memory arrays have intersections (INTERSECTION) and are divided in the bit line direction by the sense amplifier SA, while the divided memory arrays are divided in the word line direction by the sub word driver SWD. For example, the mats are designated by upper 4 bits (X7 to X10) of the X address. In this manner, in the constitution which selects the mats using 4 bits of addresses X7 to X10, the number of memory arrays divided in the bit line direction is set to 16.

The word lines of the memory array are selected by the lower 7 bits of X addresses. The lower 7 bits (X6 to X10) are used for selection of the main word lines and the FX lines which constitute pre-decoded signal lines. The FX lines are provided for selecting one sub word line in a plurality of sub word lines which are allocated to one main word line. For example, when 8 sub word lines are allocated to one main word line, the FX lines are constituted of 8 lines. 3 bits of addresses X0 to X2 are used for selecting the FX lines.

The constitution which makes the memory array of the DRAM macro of the present invention different from a memory array of the usual DRAM lies in the constitution that the dummy-word-line main word driver and the main charge word driver for the dummy cells in the selected mat are selected using a mat selection signal and the lowermost bit X0 of the addresses X. 0/1 of the lowermost bit indicates one of a pair of bit lines and hence, the main word driver for the dummy word lines adopts a logic which reads the dummy cells which are connected to the bit line BL opposite to the normal memory cells designated by the address X and charges the dummy cells.

That is, the main word driver for a dummy word line is constituted of drivers DMWL and DCMWL, wherein the driver DMWL is used for driving the dummy word line DWL1 which is used for selection of the dummy cells. On the other hand, the driver DCMWL is used for driving the dummy cell charge word line DWL0. As in the case of the embodiment shown in FIG. 4, the above-mentioned dummy word lines DWL1 and DWL0 are driven by another driver, respectively. Corresponding to such an embodiment, also in the hierarchical word line method of this embodiment, the driver DWD for driving the dummy word lines DWL1 and the driver DCWD for dummy cell charge word lines DWL0 are arranged separately at left and right sides with the memory array sandwiched therebetween. These drivers DCWD for the dummy cell charge word lines DWL0 are required for the complementary bit lines BLT and BLB, respectively, and hence, two pairs of drivers DCWD are provided corresponding to the two sense amplifier sides with the memory array sandwiched therebetween.

Figure 14:
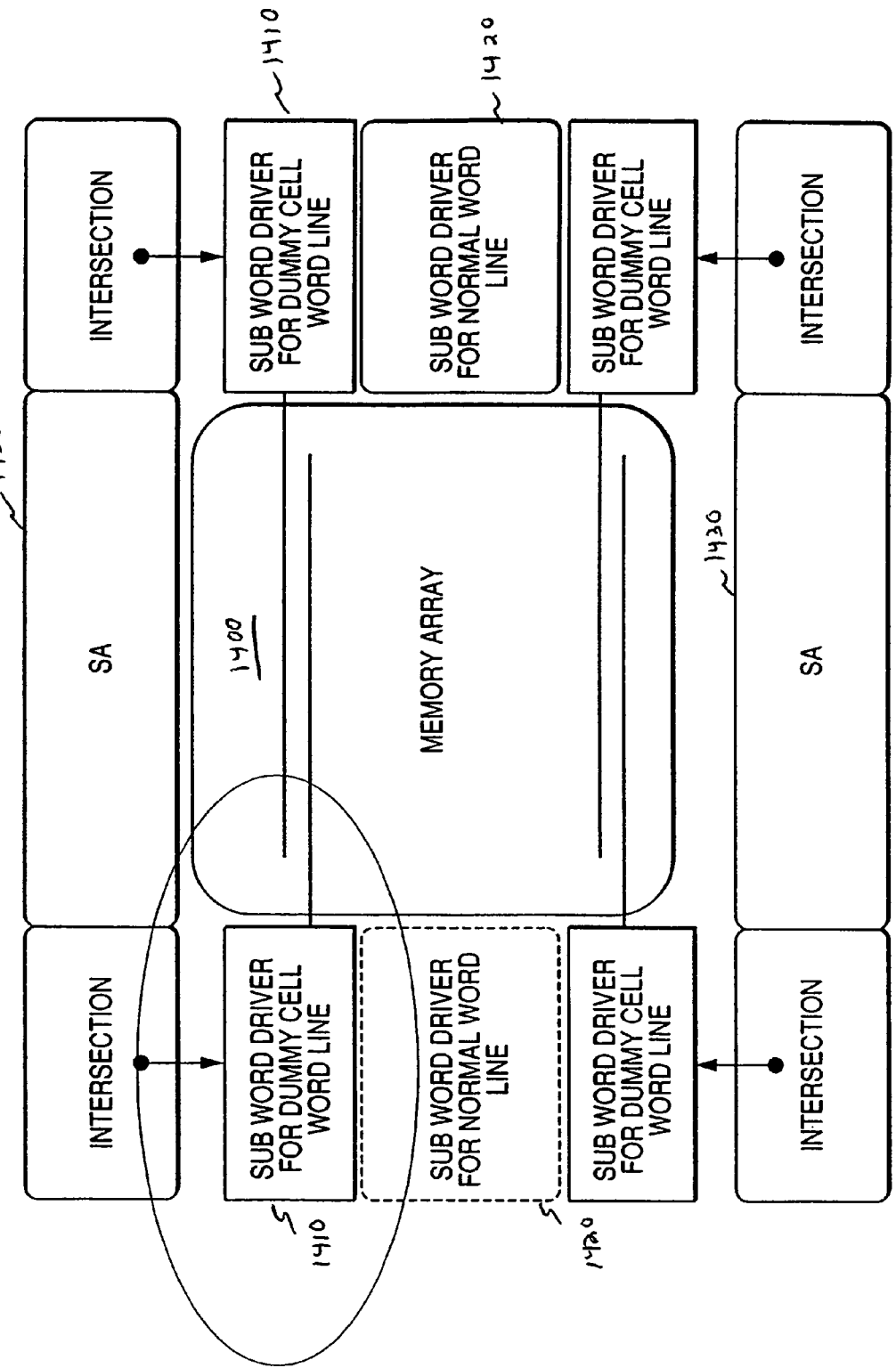
FIG. 14 is a constitutional view of one memory array shown in FIG. 13 and a peripheral circuit thereof.

FIG. 14 is a constitutional view showing one memory array and peripheral circuits thereof including intersections (INTERSECTION). Sub word drivers 1410 are provided at both sides of the memory array 1400 in the word line direction and the sub word lines are connected to the sub word drivers 1420 arranged at both sides in a dispersed manner. Due to such a constitution, it is possible to arrange the sub word drivers at a pitch twice as large as a pitch of the sub word lines. The sense amplifiers 1430 are provided at both sides of the memory array in the pitch direction. A pair of complementary bit lines which are extended in parallel are alternately connected with unit circuits of the sense amplifiers through the above-mentioned shared switch MOSFETs. Due to such a constitution, the sense amplifiers can be arranged at a pitch twice as large as a pitch of the complementary bit lines.

In this embodiment, with respect to the sub word drivers for driving the dummy cell word lines, as shown in FIG. 13, one sub word driver constitutes the driver DWD for generating a selection signal of the dummy word line DWL1, and another sub word driver constitutes the driver DWCD for generating a selection signal of the dummy word lines DWL0 for dummy cell charging, in which two pairs of sub word drivers are provided at two sense amplifier sides corresponding to the above-mentioned complementary bit lines BLT and BLB, respectively.

With respect to the main word drivers DMWL, DCMWL and the sub word drivers DWD, DCWD for dummy cells shown in FIG. 13, when the mat is selected, for the bit lines BLT (or BLB) to which the selection memory cells are connected, either one of the above-mentioned two pairs is selected to select the dummy cells which are connected to the bit lines BLB (or BLT), wherein the main word drivers and the sub word drivers are selected at the probability of 1/2 when the mat is selected. Accordingly, there arises the deterioration of the MOSFET which constitutes the drivers DMWL, DCMWL and DWD, DCWD attributed to hot carriers.

Figure 15:
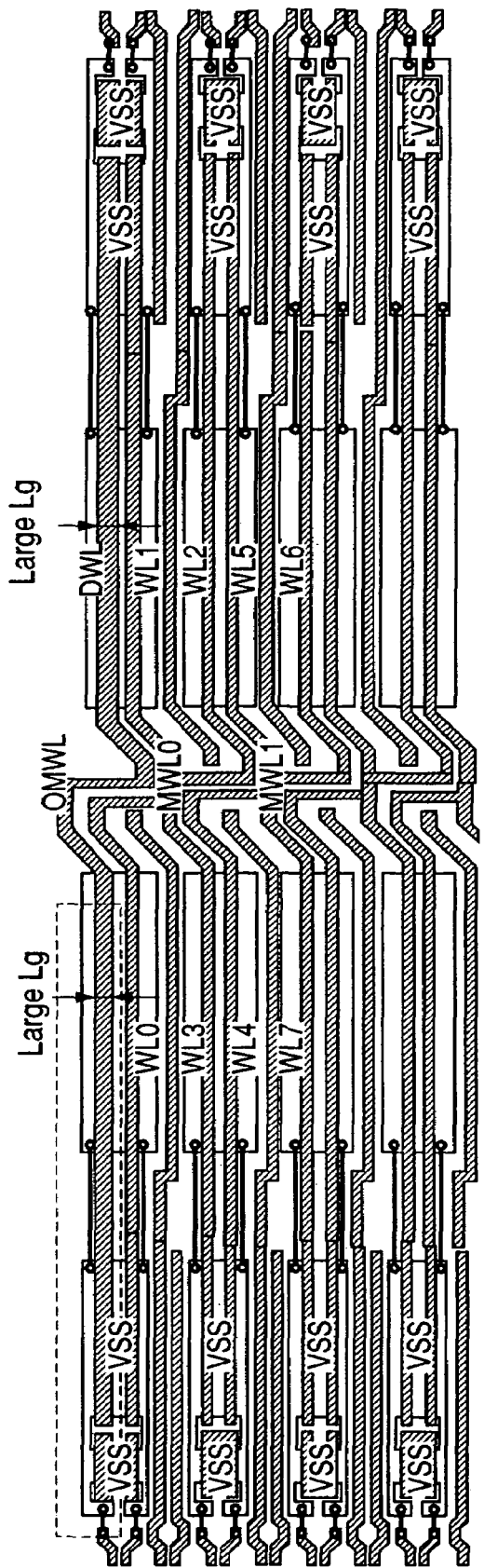
FIG. 15 is a layout view showing one embodiment of a MOSFET which constitutes a sub-word driver DWD (DCWD) for dummy cells shown in FIG. 13.

FIG. 15 shows a layout of one embodiment of the MOSFET which constitutes the dummy-cell sub word driver DWD (DCWD) and main word lines (OMWL, MWL0 and MWL1). In the drawing, the MOSFET which constitutes the sub word driver for dummy cells DWD (DCWD) is shown together with the MOSFET which constitutes the sub word driver SWD for normal memory cells. In this embodiment, to prevent the deterioration of the MOSFET attributed to the hot carrier, a gate length Lg of the MOSFET which constitutes the dummy cell sub word driver DWD assumes a value larger than a gate length of a gate electrode of the MOSFET which constitutes the sub word drivers SWD corresponding to the normal word lines WL0, WL1 which are arranged close to the sub word driver DWD for dummy cells. That is, by setting a line width of the gate electrode (LARGE lg) of the MOSFET which constitutes the sub word driver SWD for the dummy cells larger than a line width of the gate electrode of the MOSFET which constitutes the sub word driver SWD for the normal word lines WL0, WL1, it is possible to prevent the deterioration attributed to the hot carrier.

Further, although not shown in the drawing, in the same manner as the above-mentioned sub word drivers, to prevent the deterioration of the main word drivers DMWLD (DCMWLD) which drive the dummy cell sub word drivers DWD (DCWD) attributed to the hot carrier, a gate length Lg of the MOSFET which constitutes the main word driver DMWLD for driving the sub word driver DWD (DCWD) assumes a value larger than a gate length of a gate electrode of the MOSFET which constitutes the main word drivers MWLD corresponding to the normal word lines WL0, WL1 which are arranged close to the dummy cell sub word driver DWD (DCWD). That is, by setting a line width of the gate electrode of the MOSFET which constitutes the dummy cell main word driver DMWLD larger than a line width of the gate electrode of the MOSFET which constitutes the main word driver MWLD for the normal word lines WL0, WL1, it is possible to prevent the deterioration attributed to the hot carrier.

Figure 16:
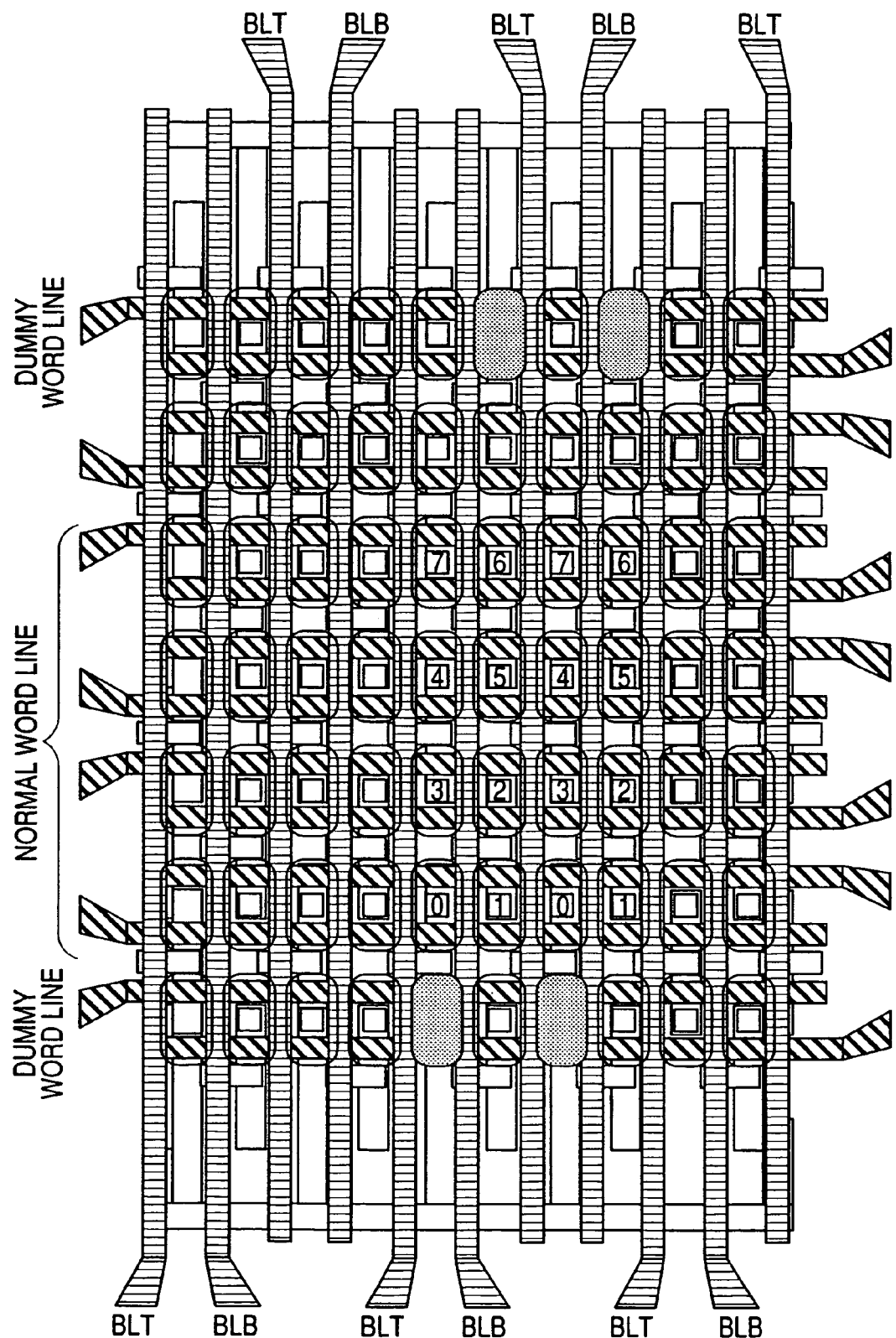
FIG. 16 is a schematic layout view showing one embodiment of a memory array shown in FIG. 14.
Figure 17:
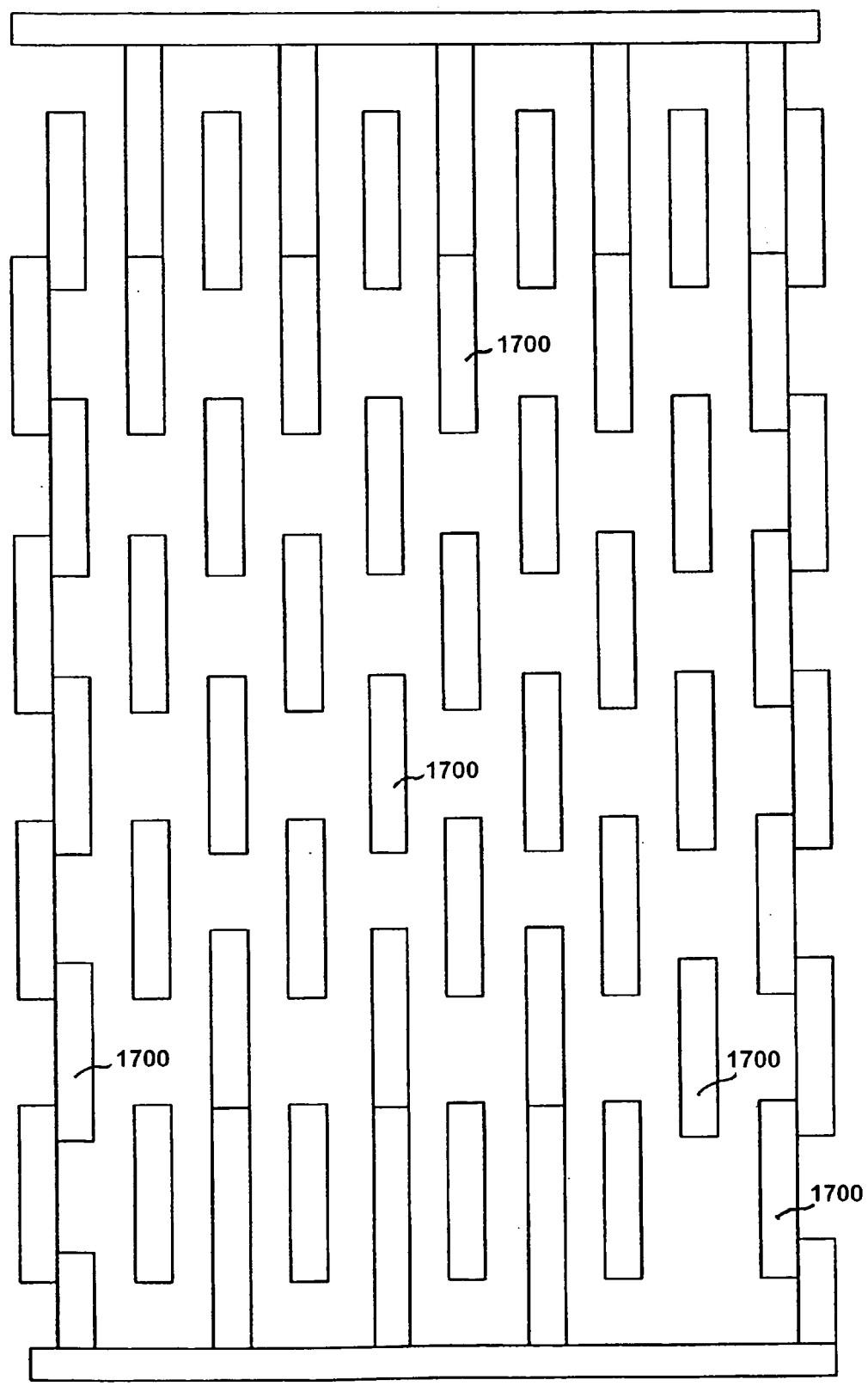
FIG. 17 is a layout view of a diffusion layer of the memory array shown in FIG. 16.

FIG. 16 is a schematic layout view of one embodiment of the memory array 1400 shown in FIG. 14, while FIG. 17 is a layout view of the diffusion layers 1700. In the constitution of this embodiment, originally arranged dummy memory cells (unused memory cells which are arranged to maintain the formability of normal memory cells) are utilized as the dummy memory cells, and the word lines WL and the transfer MOSFETs in the outermost periphery (sense amplifier side) are used as a dummy cell charging circuit. Due to such a constitution, it is possible to realize the VSS precharge without increasing the substantial layout area.

Figure 18:
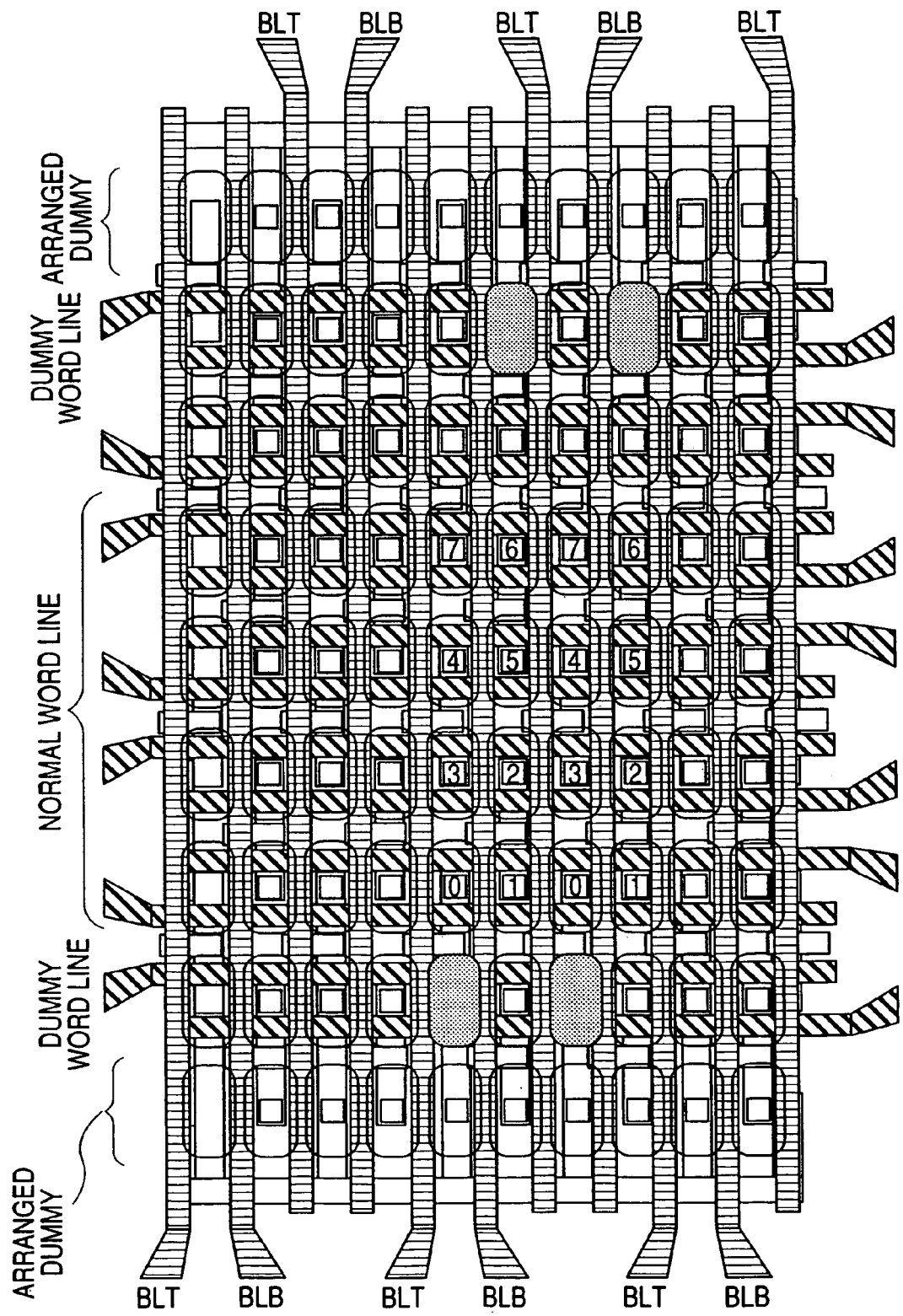
FIG. 18 is a schematic layout view showing another embodiment of the memory array shown in FIG. 14.
Figure 19:
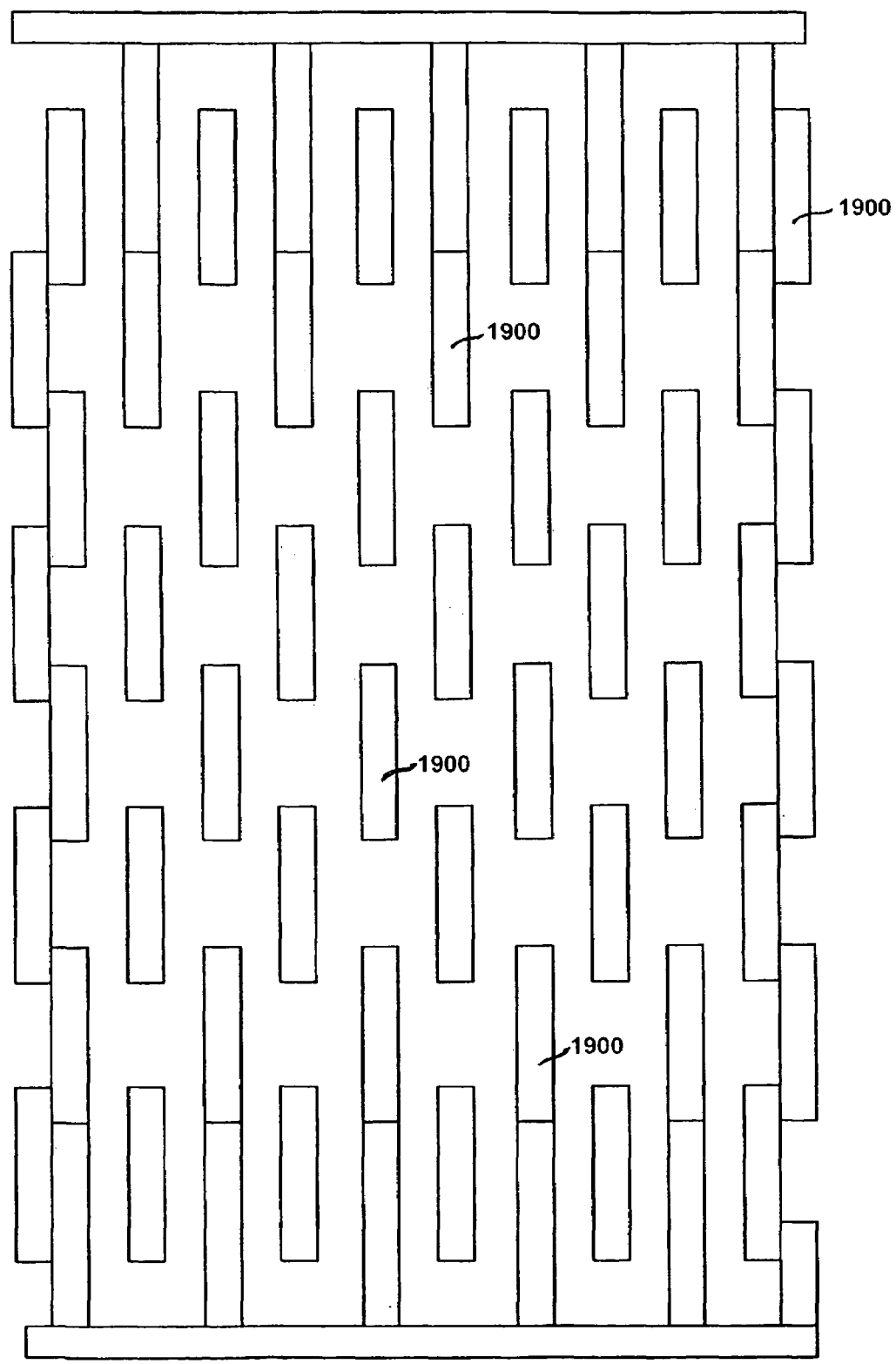
FIG. 19 is a layout view of diffusion layers of the memory array shown in FIG. 18.

FIG. 18 is a schematic layout view of another embodiment of the memory array 1400 shown in FIG. 14, while FIG. 19 is a layout view of diffusion layers 1900 thereof. With respect to the embodiment shown in FIG. 16, due to the coarseness and denseness of the layout pattern, there exists a possibility that the outermost periphery differs from the normal portion in size after completion. Accordingly, in this embodiment, another row of memory cells are arranged around the outermost periphery as arranged dummies (ARRANGED DUMMY). Due to such a constitution, compared to the usual memory array, although an area corresponding to one row of capacitors is increased, the formability of dummy cells is enhanced and hence, the capacitance irregularities between the dummy cells and the normal memory cells can be suppressed, thereby a noise margin can be enhanced.

Figure 20:
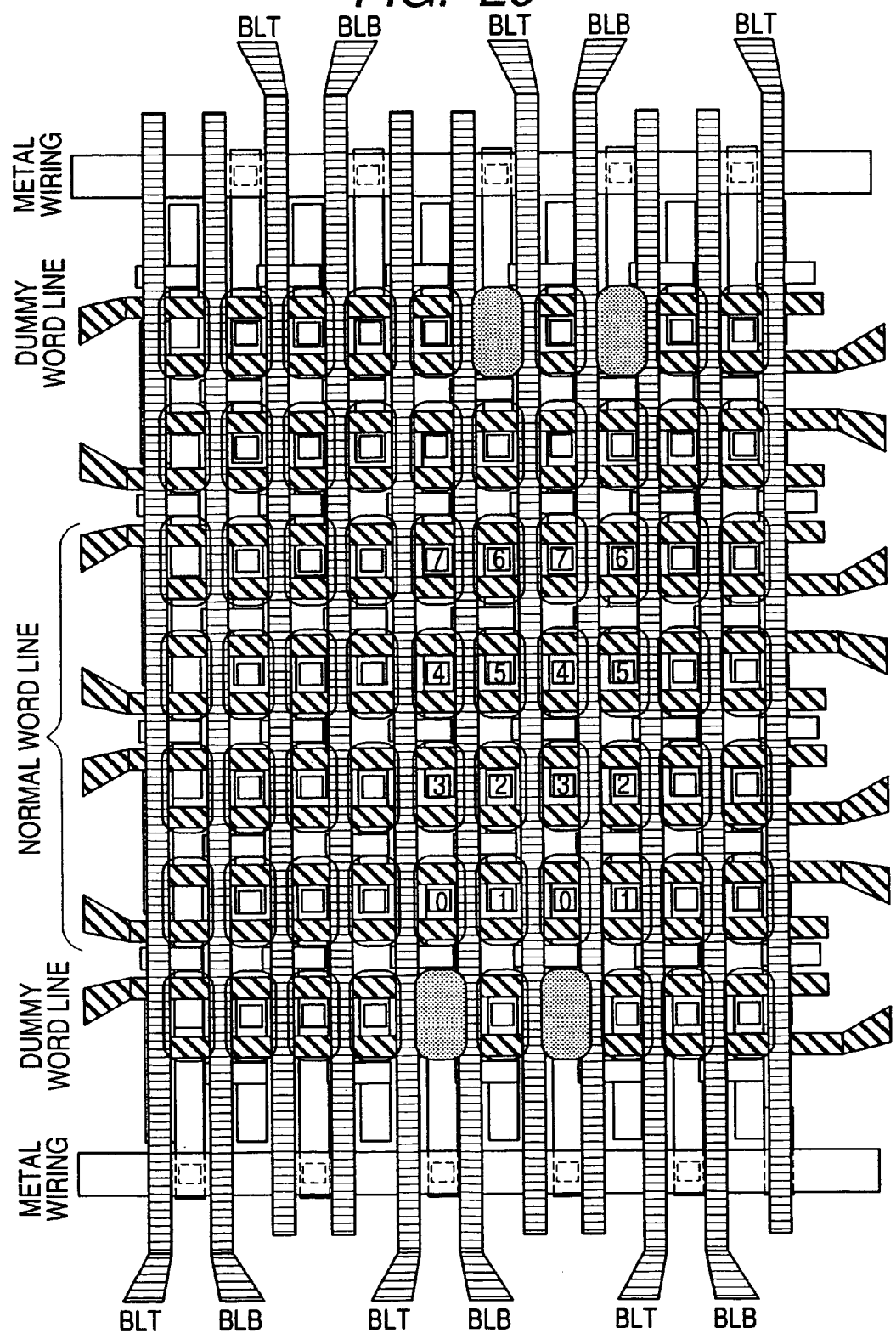
FIG. 20 is a schematic layout view showing still another embodiment of the memory array shown in FIG. 14.
Figure 21:
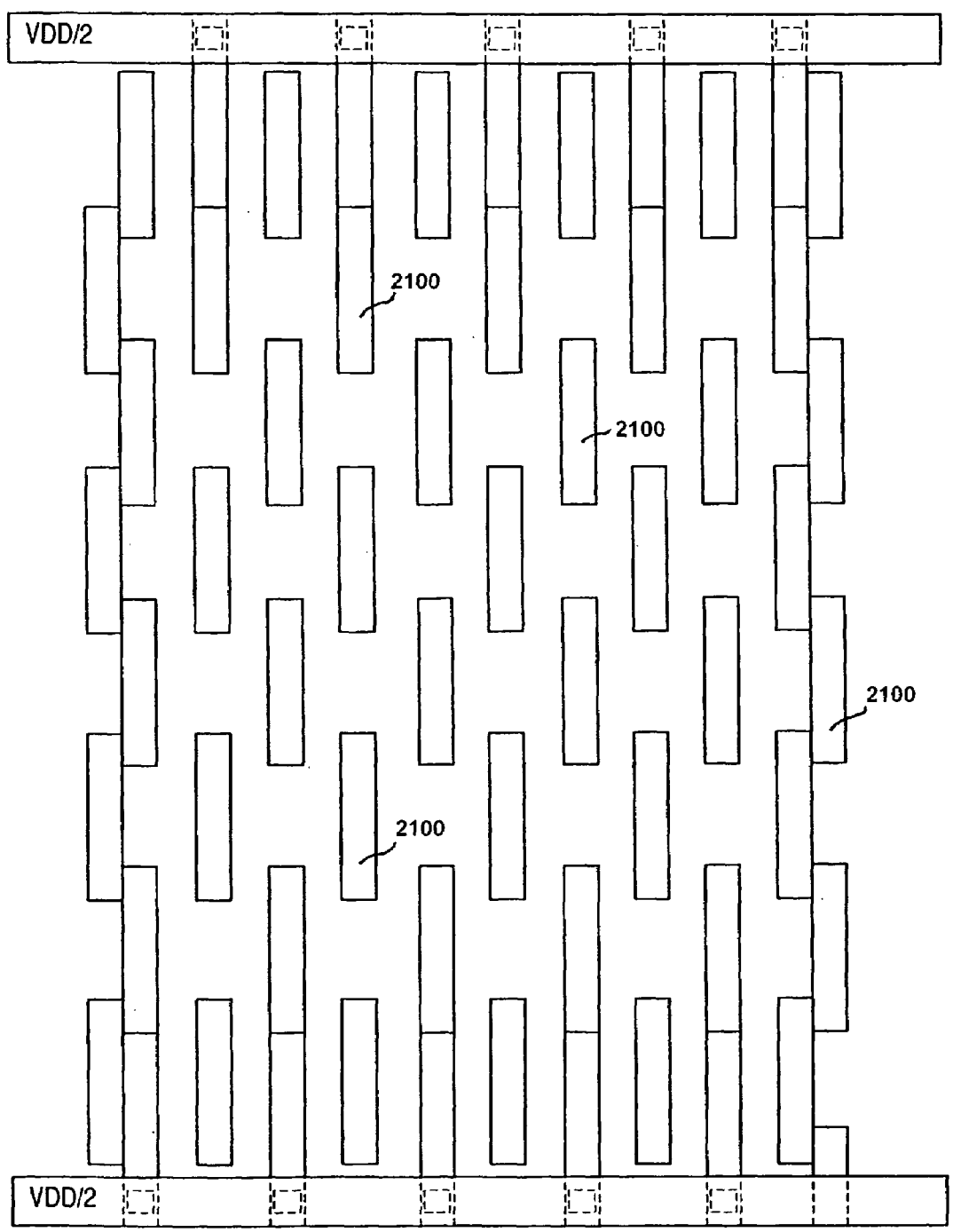
FIG. 21 is a layout view of diffusion layers of the memory array shown in FIG. 20.

FIG. 20 is a schematic layout view of still another embodiment of the memory array 1400 shown in FIG. 14, while FIG. 21 is a layout view of diffusion layers 2100 thereof. This embodiment shows the constitution in which the guard ring (See FIG. 22) portions for diffusion layers which are arranged in parallel with the word lines are replaced with metal wiring (METAL WIRING)/BL wiring. Although a voltage drop may be generated at a center portion of the memory array due to high resistance of the diffusion layers (See FIG. 22), the use of the low-resistance lines can remove this fear. Further, it is possible to shorten the dummy cell charging period shown in FIG. 11 and hence, the memory cycle can be executed rapidly.

Figure 22:
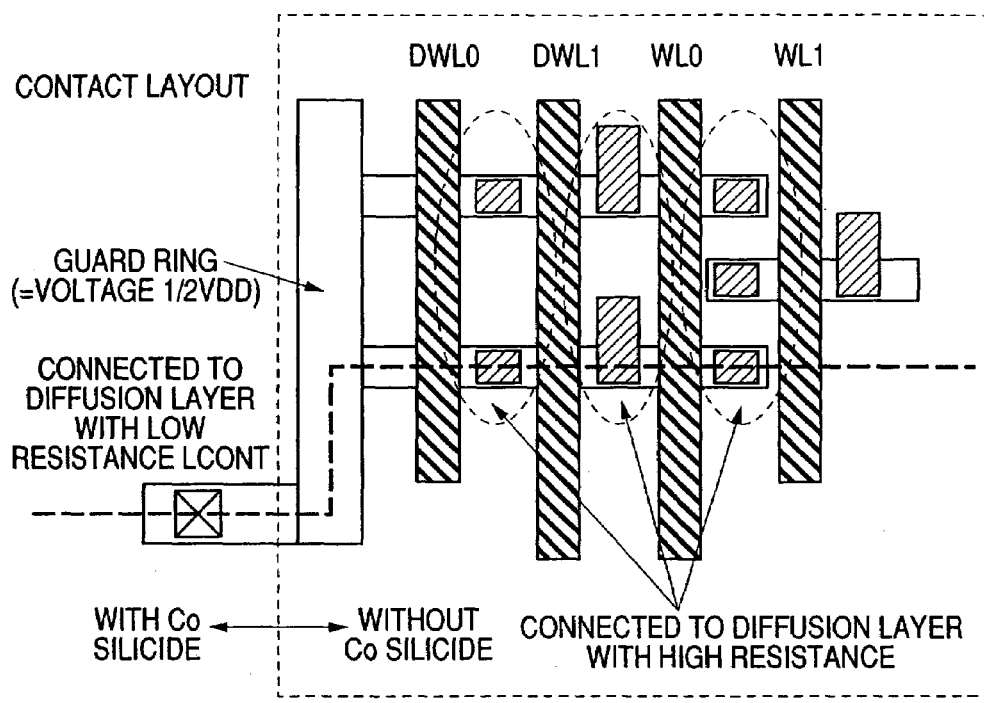
FIG. 22 is a schematic layout view showing still another embodiment of the memory array according to the present invention.
Figure 23:
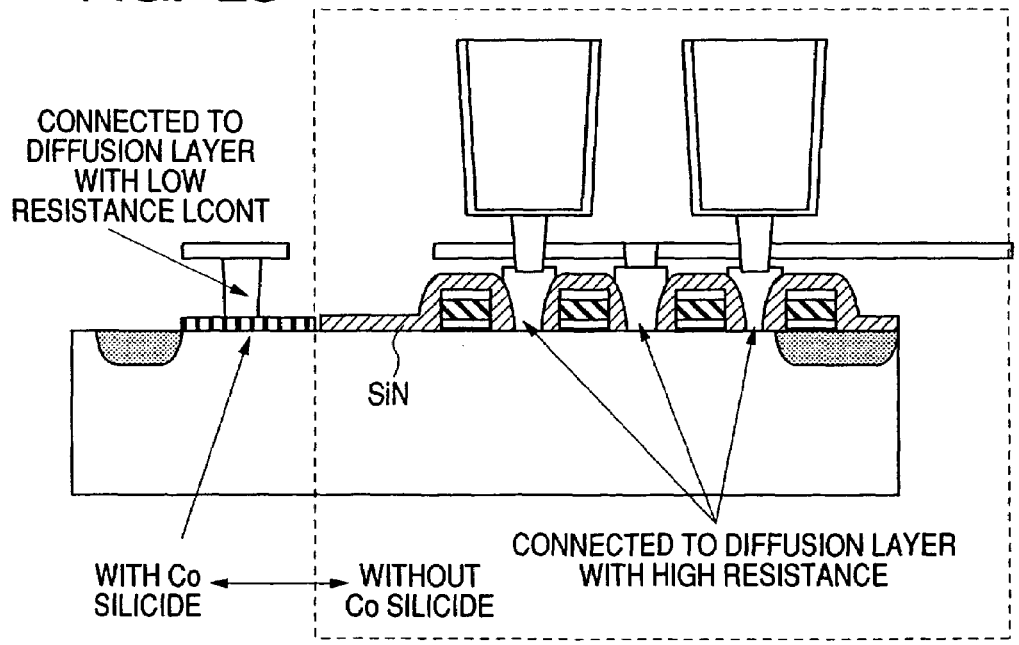
FIG. 23 is a schematic cross-sectional view of elements of the memory array shown in FIG. 22.

FIG. 22 is a schematic layout view of another embodiment of the memory array according to the present invention, while FIG. 23 is a schematic cross-sectional view of an element thereof. This embodiment is directed to the constitution in which a voltage is supplied to guard rings of diffusions layers which supply VDD/2 to the respective dummy cells. As shown in FIG. 22 and FIG. 23, usually, the diffusion layers in the inside of the memory array (shown inside the dashed box without Co SILICIDE) are not formed into silicide and hence, a contact cannot be established thereon. To use plugs which are similar to the memory cells to establish the contact, the contact exhibits the high resistance. Accordingly, this embodiment provides a layout of the contact in which, to form only a portion where the contact is established into silicide (with Co SILICIDE), the diffusions layers are extended such that the silicide removal layer does not cover the portion where the contact is established and VDD/2 is supplied to the contact.

Figure 24:
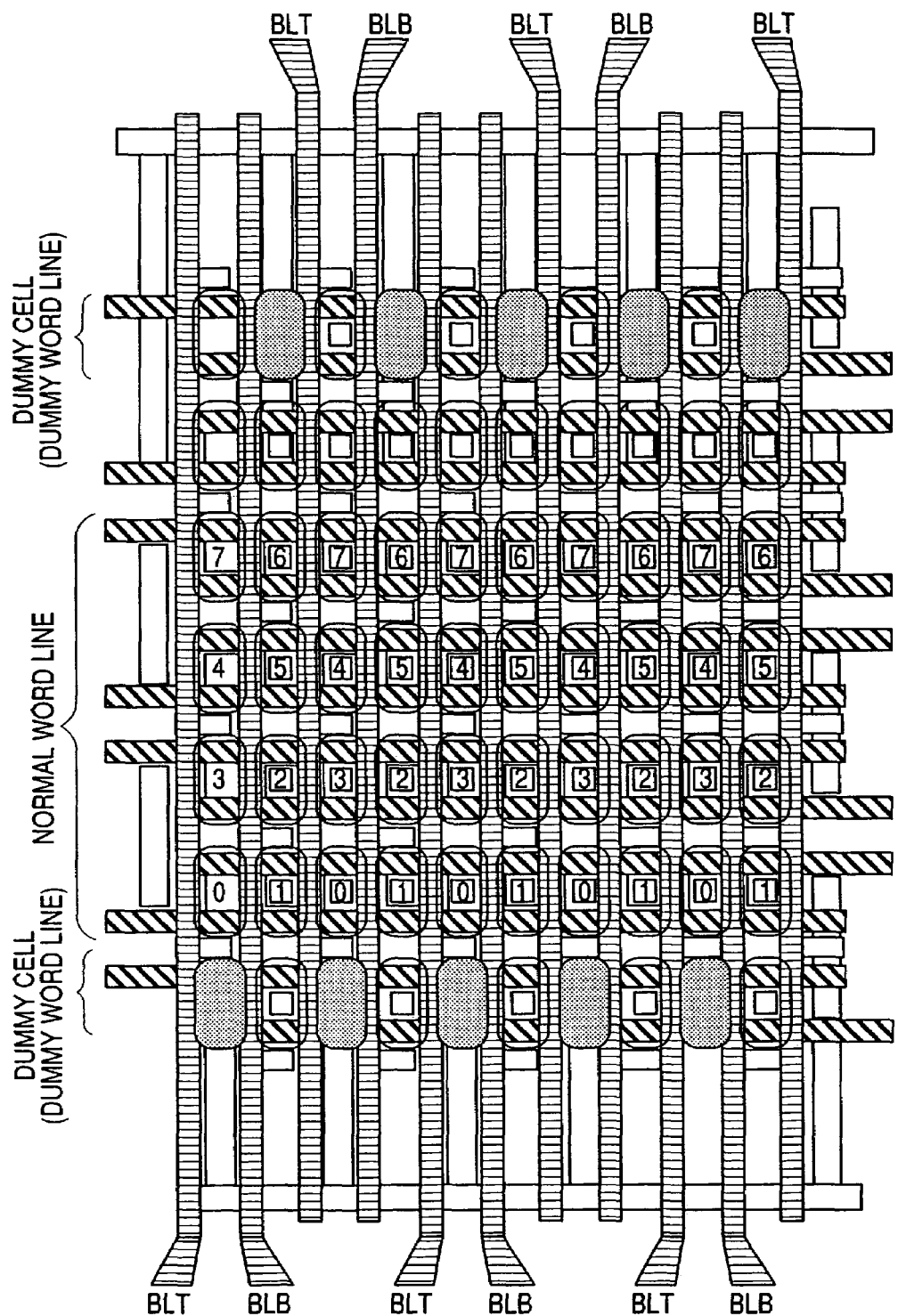
FIG. 24 is a schematic layout view showing still another embodiment of the memory array shown in FIG. 14.
Figure 25:
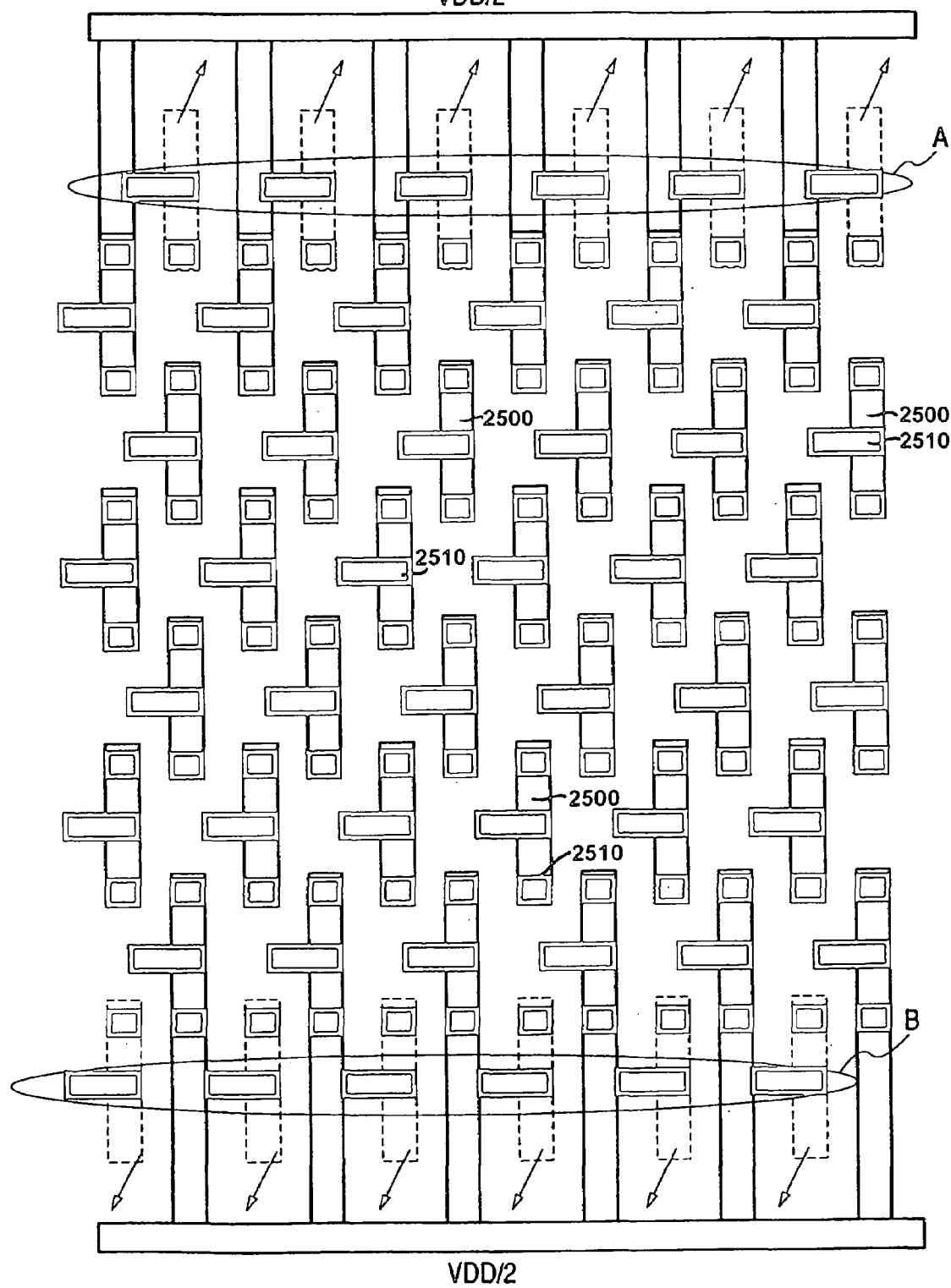
FIG. 25 is a layout view of diffusion layers and plug layers shown in FIG. 24.
Figure 26:
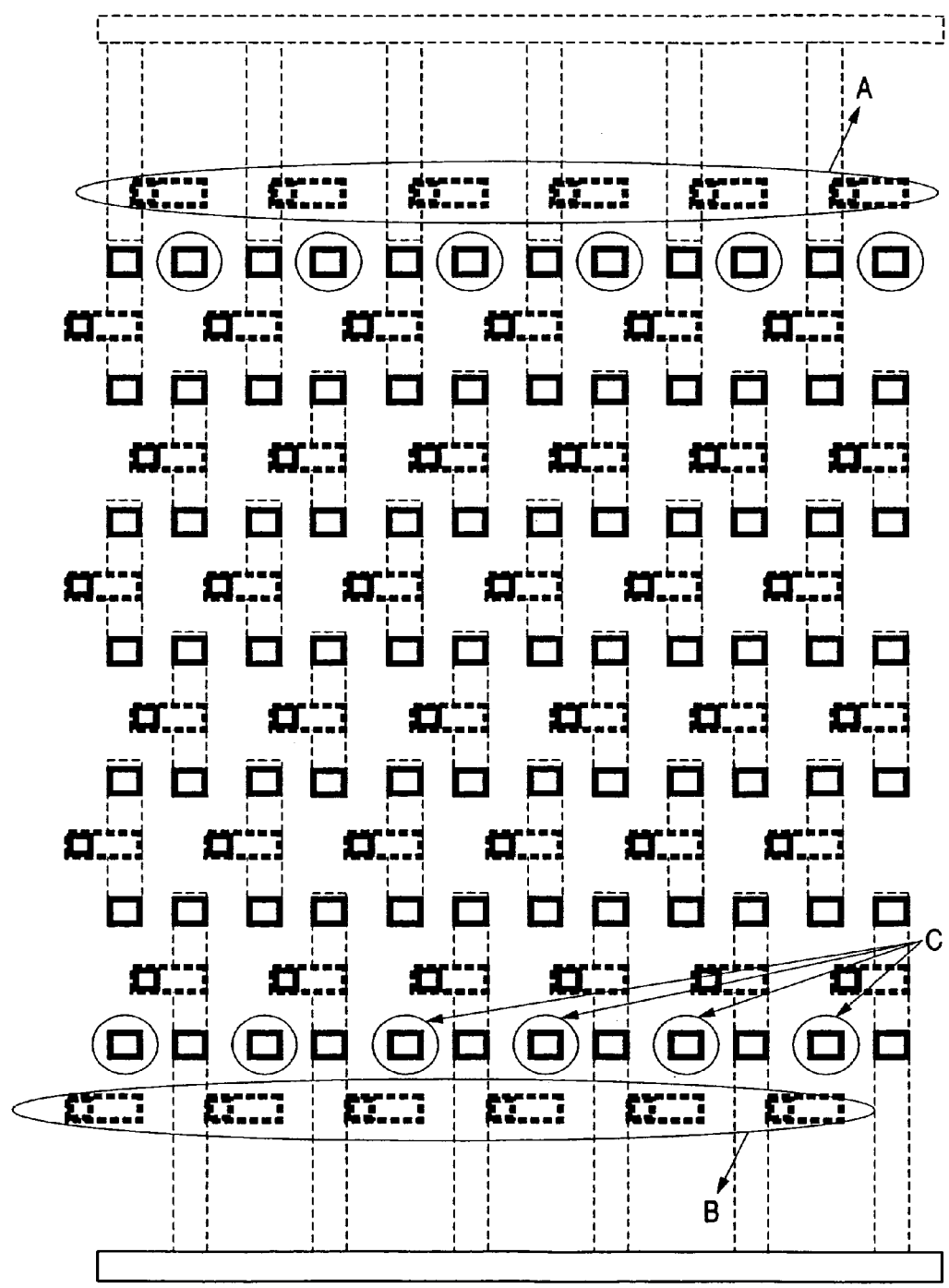
FIG. 26 is a layout view of contact portions (SCNT, BLCT) of the memory array shown in FIG. 24.

FIG. 24 is a schematic layout view of still another embodiment of the memory array 1400 shown in FIG. 14, while FIG. 25 is a layout view of the diffusion layers 2500 and plug layers 2510 in FIG. 24. In FIG. 26, a layout of contact portions (SCNT, BLCT) shown in FIG. 24 is also shown. In the above-mentioned embodiment, in utilizing the arranged dummy memory cells as dummy memory cells and using the word lines WL and the transfer MOSFET in the outermost periphery as dummy charging circuits, a shape of the diffusion layers may change. In view of the above, this embodiment performs the above-mentioned layout change of the diffusion layers as shown in FIG. 25.

That is, the layout of the diffusion layers, each of which are provided between the diffusion layers which are extended for precharging, is difficult and hence, these diffusion layers are removed as indicated by arrows and dotted lines. Then, portions of the plugs A, B which are connected to the removed diffusion layers are left as dummies to prevent the plugs which are used in an actual operation from constituting the outermost periphery. Due to such a constitution, the operating plugs per se have a neighboring pattern which is not different from a neighboring pattern of the plugs inside the memory array. Since it is possible to prevent a state that the neighboring pattern becomes coarse only in the outer peripheral portion, the process fluctuation can be suppressed. Further, the layout of the contact portions BCLT on the plug can be designed as shown in FIG. 26. That is, since the diffusion layers are extended to establish the connection with VDD/2, the VDD/2 level of the guard ring portion and the bit lines may be short-circuited via the plugs. That is, removing the BLCT layers while leaving the plugs at portions A and B in FIG. 26 can prevent the occurrence of the above-mentioned short-circuiting. Further, portions C in FIG. 26 are capacitor portions having no diffusion layers.

Figure 27:
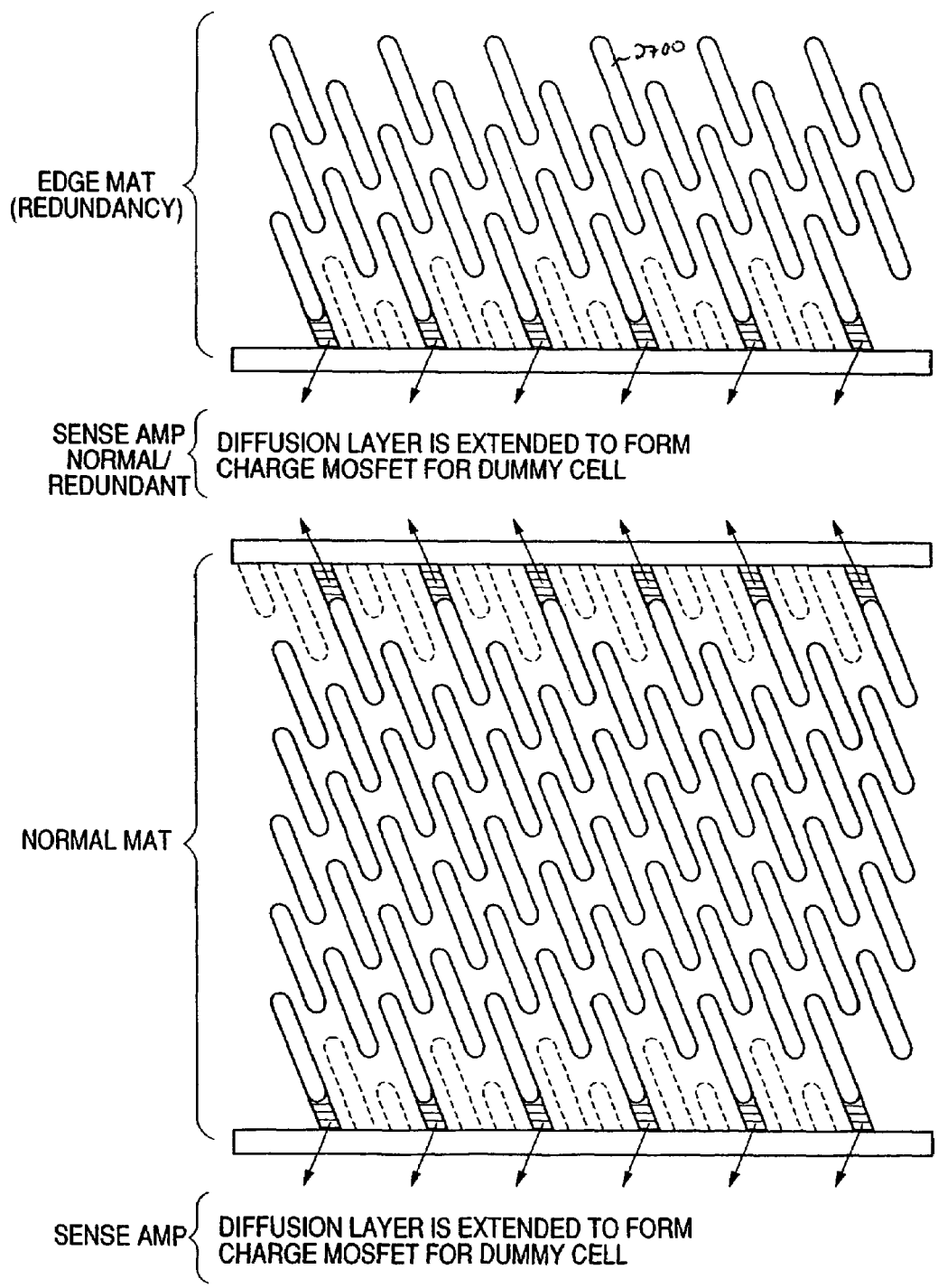
FIG. 27 is a layout view of diffusion layers showing another embodiment of the memory array according to the present invention.
Figure 28:
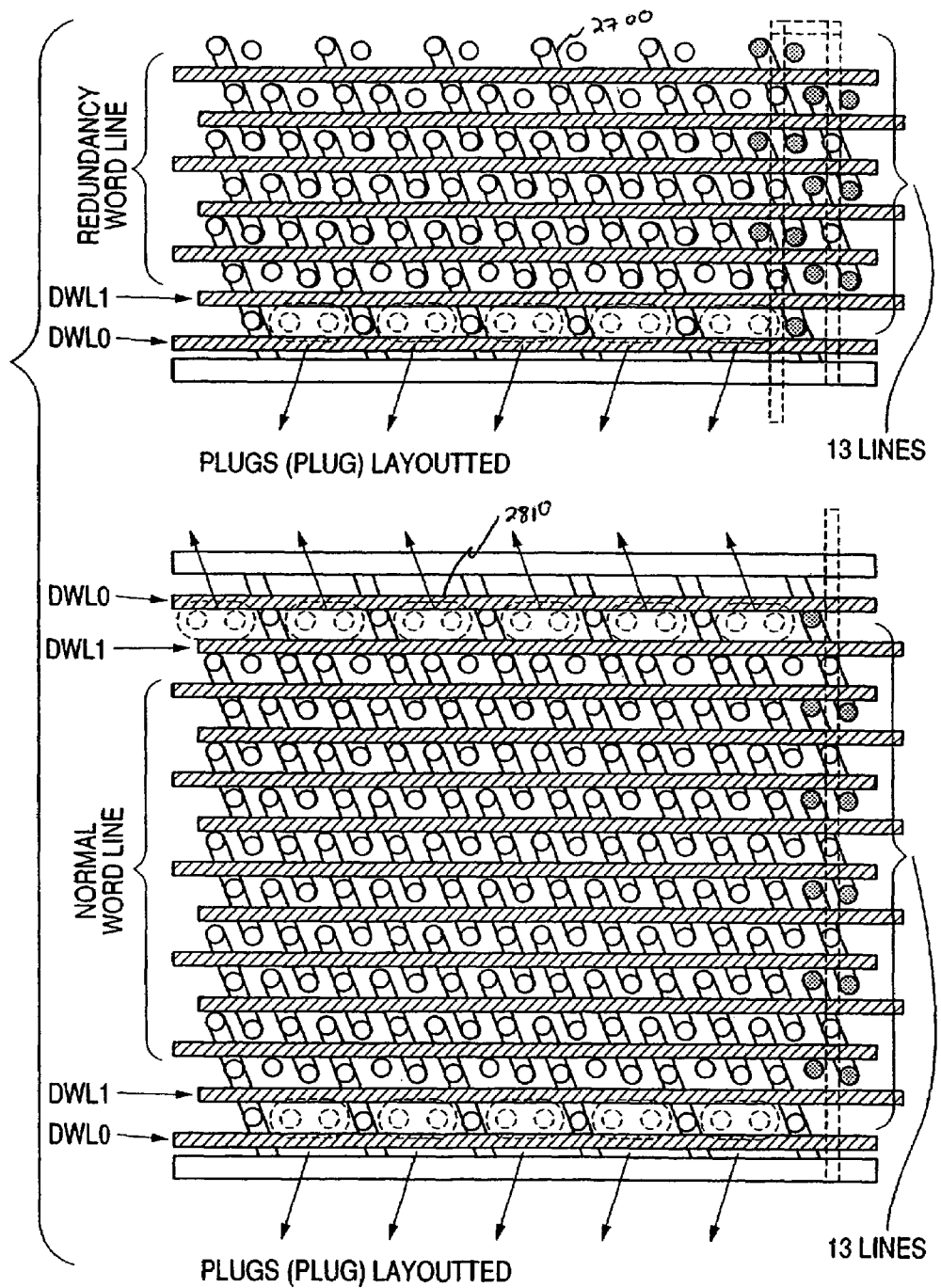
FIG. 28 is a layout view of word line/plug layers and layers arranged below the word line/plug layers showing another embodiment of the memory array according to the present invention.
Figure 29:
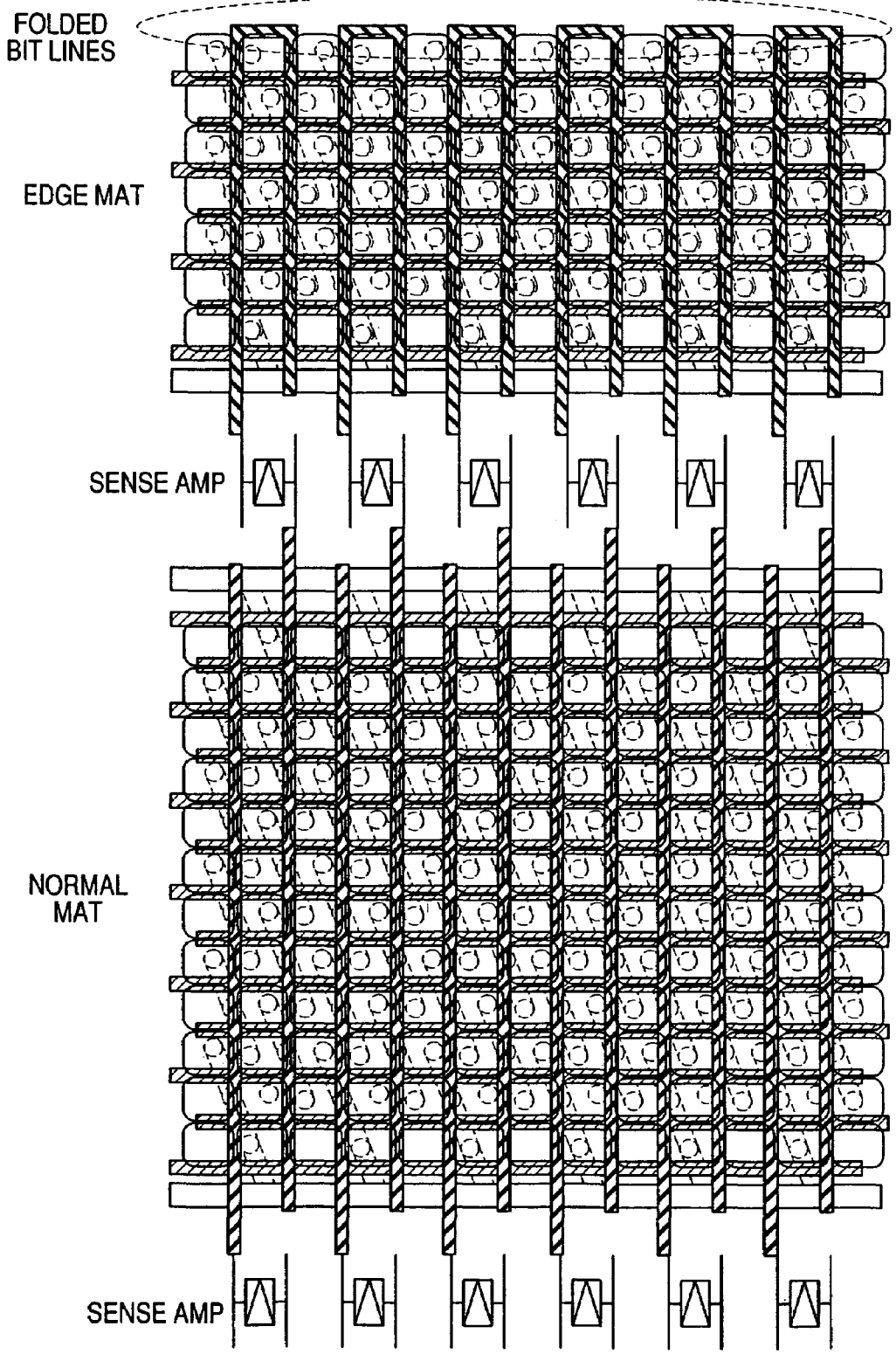
FIG. 29 is a layout view of capacitor/bit line and layers arranged below the capacitor/bit line showing another embodiment of the memory array according to the present invention.

FIG. 27, FIG. 28 and FIG. 29 show layouts of another embodiment of the memory array of the DRAM according to the present invention. This embodiment is directed to a so-called one crossing-point method in which while arranging the sense amplifier at the center, the complementary bit lines BLT, BLB are arranged at both sides of the sense amplifier. The layout of the diffusion layers 2700 is shown in FIG. 27, the layout of the word lines/plug layers and succeeding lower layers is shown in FIG. 28, and the layout of the capacitor/bit line layer and succeeding lower layers is shown in FIG. 29. In the layout of diffusion layer shown in FIG. 27, in the same manner as the case which adopts the above-mentioned two-crossing point memory cells, by extending the diffusion layers at the end of the memory array adopting the one crossing-point method, it is possible to constitute the dummy cells and dummy cell charging circuit necessary for the VSS precharge.

In the same manner as the memory array adopting the two crossing-point method, also in this embodiment which adopts the one crossing-point method, the diffusion layers at the end of the memory array are extended and the pattern density of the periphery is changed. Accordingly, this embodiment changes the layout to increase the short margin. Removing the unused diffusion layers 2710 between the extended diffusion layers as indicated by dotted lines shown in FIG. 27 can prevent the layout pattern from becoming dense. Further, as shown in FIG. 28, the layout of some plug layers 2810 at the memory array end is not designed to prevent the short-circuiting between the extended layers and the bit lines.

Further, the layout of the capacitors and the bit lines is designed as shown in FIG. 29. In one crossing-point type memory cell, it is necessary to make the layout such that the sense amplifier is arranged between the mats (i.e., the edge mat and the normal mat) and hence, when the memory array is divided in accordance with the mats as shown in FIG. 13, invalid bit lines are present at the edge mats. However, by folding back the bit lines as shown in the dotted line portion of FIG. 29, the invalid bit lines can be eliminated and, at the same time, the area can also be halved. A point which requires attention in performing such a layout is that it is necessary to maintain the bit line capacitance at the same level as the capacitance of bit lines of the normal mats. Hence, the layout is made such that the number of plugs arranged closest to each other which constitute main factors of the bit line capacitance become equal as shown in FIG. 28 (13 pieces in the illustrated drawing).

When the layout is performed by folding back the bit lines in the above-mentioned manner, the same bit line crosses one word line twice and hence, when the word line rises, transfer MOSFETs at two positions are turned on. This substantially implies that the memory cell capacitance is doubled and hence, it is possible to have an advantageous effect that the read margin of the "H" (high level) side is enhanced. Further, even when either one of the memory cell and the transfer MOSFET is defective, so long as one of them can be used, it is possible to ensure the signal quantity equivalent to the bit lines of the usual mats and hence, it is possible to reduce the possibility that the edge mats become defective. This implies that by using these edge mats which can decrease the possibility of becoming defective as the redundancy mats, the relief efficiency can be enhanced.

Figure 30:
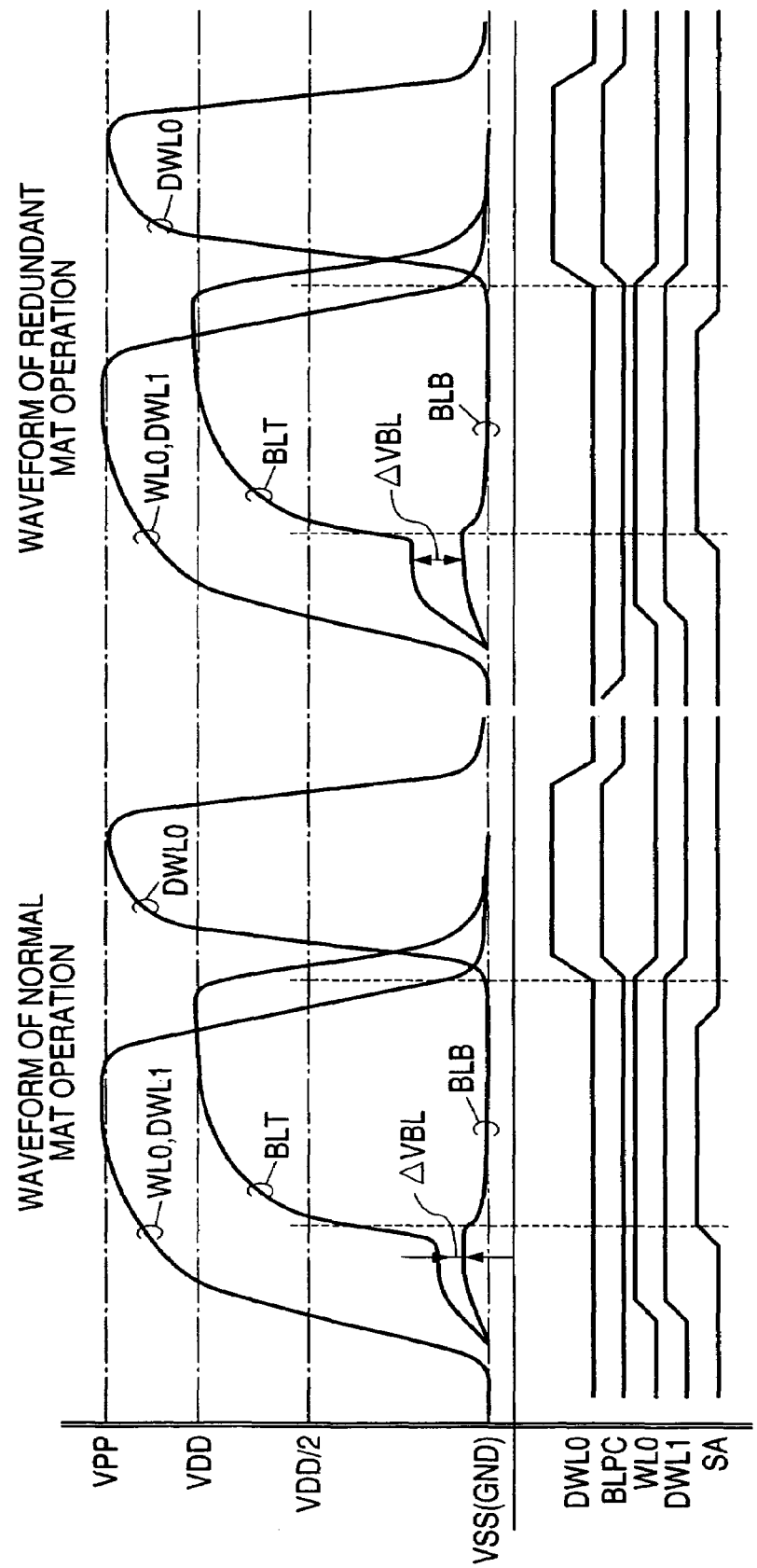
FIG. 30 is a waveform chart for explaining one example of an operation of one crossing point method memory cell shown in FIG. 28 to FIG. 29.

FIG. 30 is a waveform chart for explaining one example of the operation of the above-mentioned one crossing-point method memory cells. This embodiment shows how the array operation waveform is changed between the normal mats and the redundancy mats when the edge mats are used as the redundancy mats as shown in FIG. 29. Two memory cells are connected to the redundancy mat and hence, at the time of reading out "H" data, an amount of minute signals ΔVDL which is twice as large as an amount of minute signals ΔVDL at the usual operation is read. An amount of minute signals ΔVDL which is three times as large as the bit line potential of which constitutes the reference can be ensured and hence, the margin is enlarged.

Figure 31A:
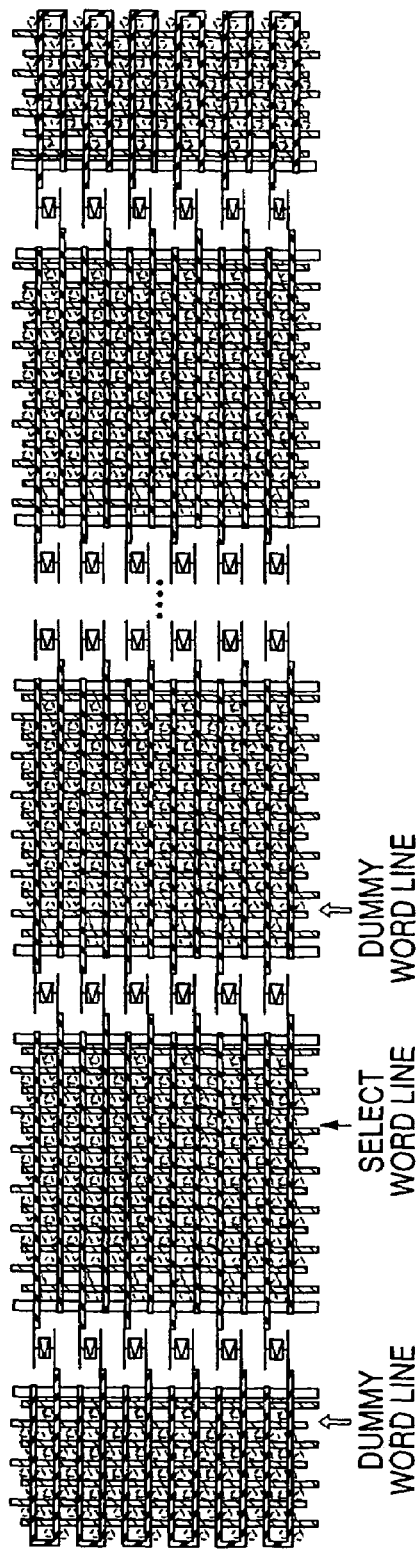
FIG. 31A and FIG. 31B are explanatory views of a selection operation of word lines of one crossing point DRAM shown in FIGS. 28 and 29.
Figure 31B:
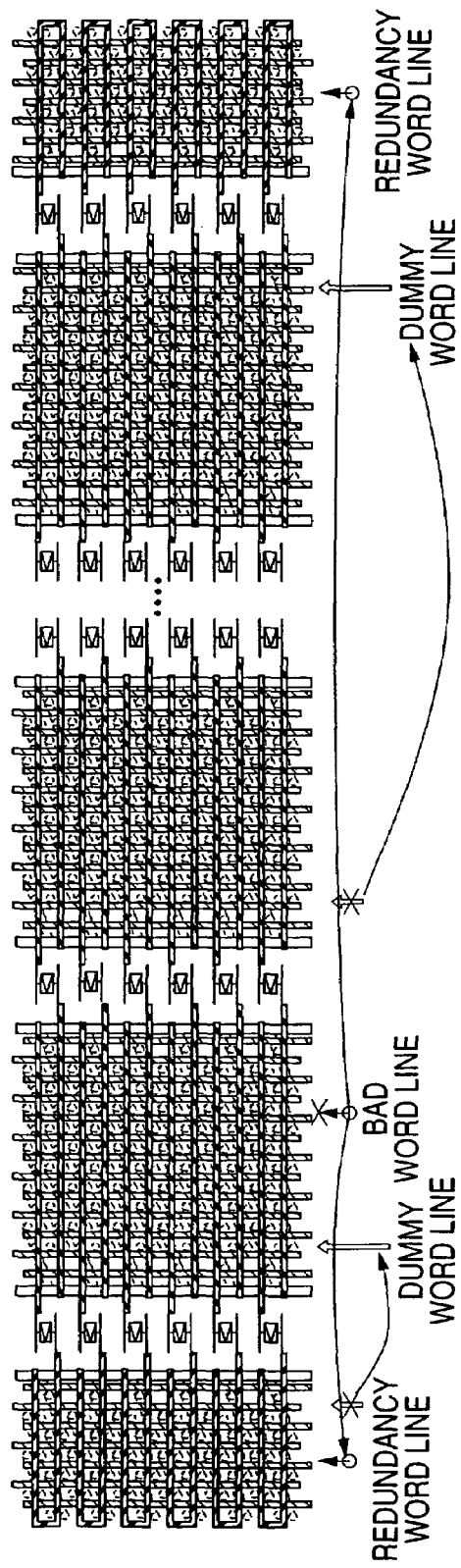

FIG. 31A and FIG. 31B are explanatory views of the selective operation of the word lines of the above-mentioned one crossing-point-method DRAM. When the word line which corresponds to a certain address is selected as shown in FIG. 31A, it is necessary to read the dummy cells to the bit lines which use the sense amplifier in common and hence, the word lines for the dummy cells formed on the mats which are provided at both sides of the bit lines are also activated. Accordingly, the selected word lines become defective. When the selected word line is relieved by the redundancy word line as shown in FIG. 31B, that is, when the selected word line is replaced with the redundancy word line at the edge mat, the dummy word line corresponding to the above-mentioned defective word line is not selected. Instead, the dummy cell word line in the mat arranged close to the edge mat on which the redundancy word line is formed is activated.

Figure 1:
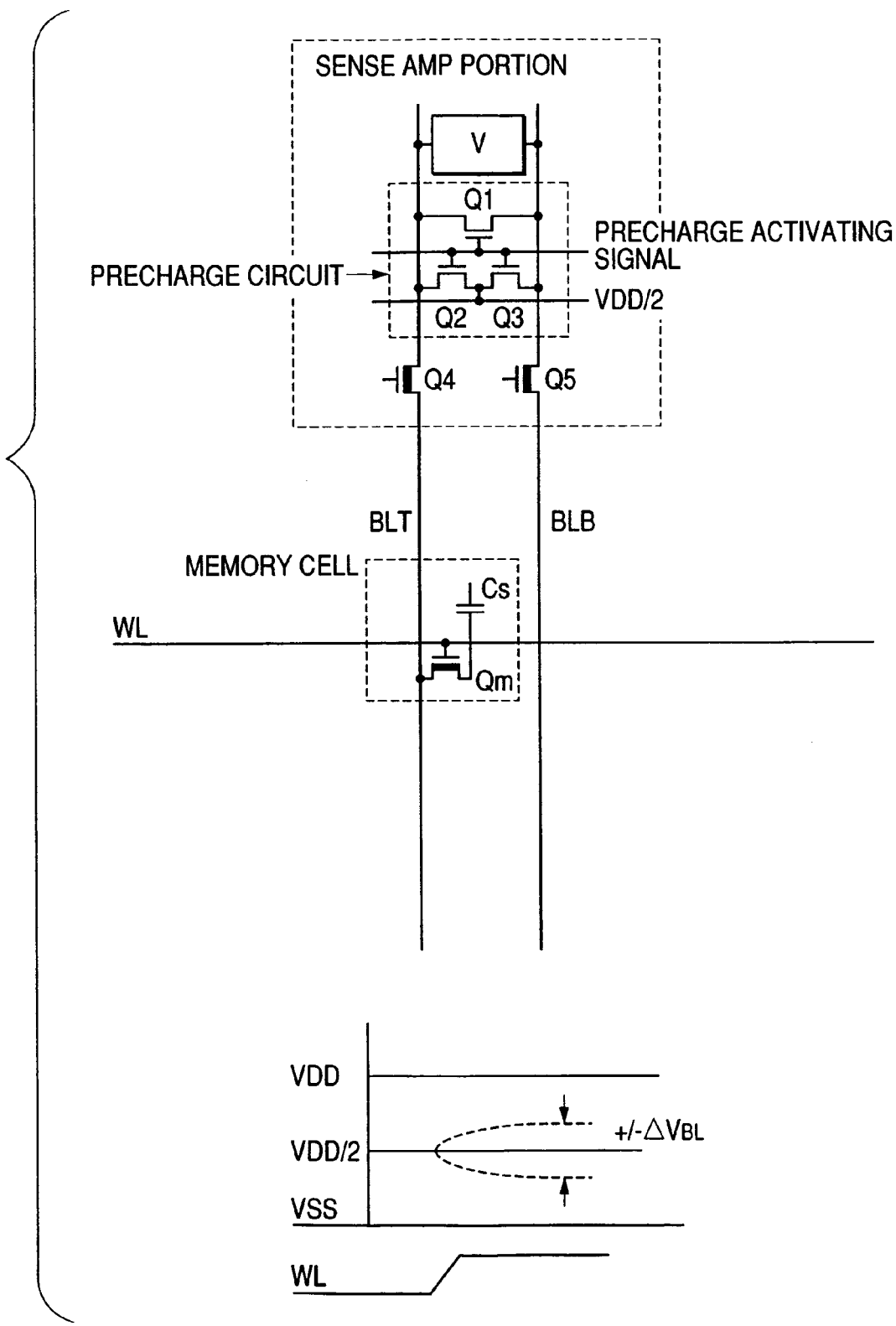
FIG. 1 is a schematic circuit diagram showing a DRAM adopting a VDD/2 precharge method which was studied in the course of arriving at the present invention.
Figure 2:
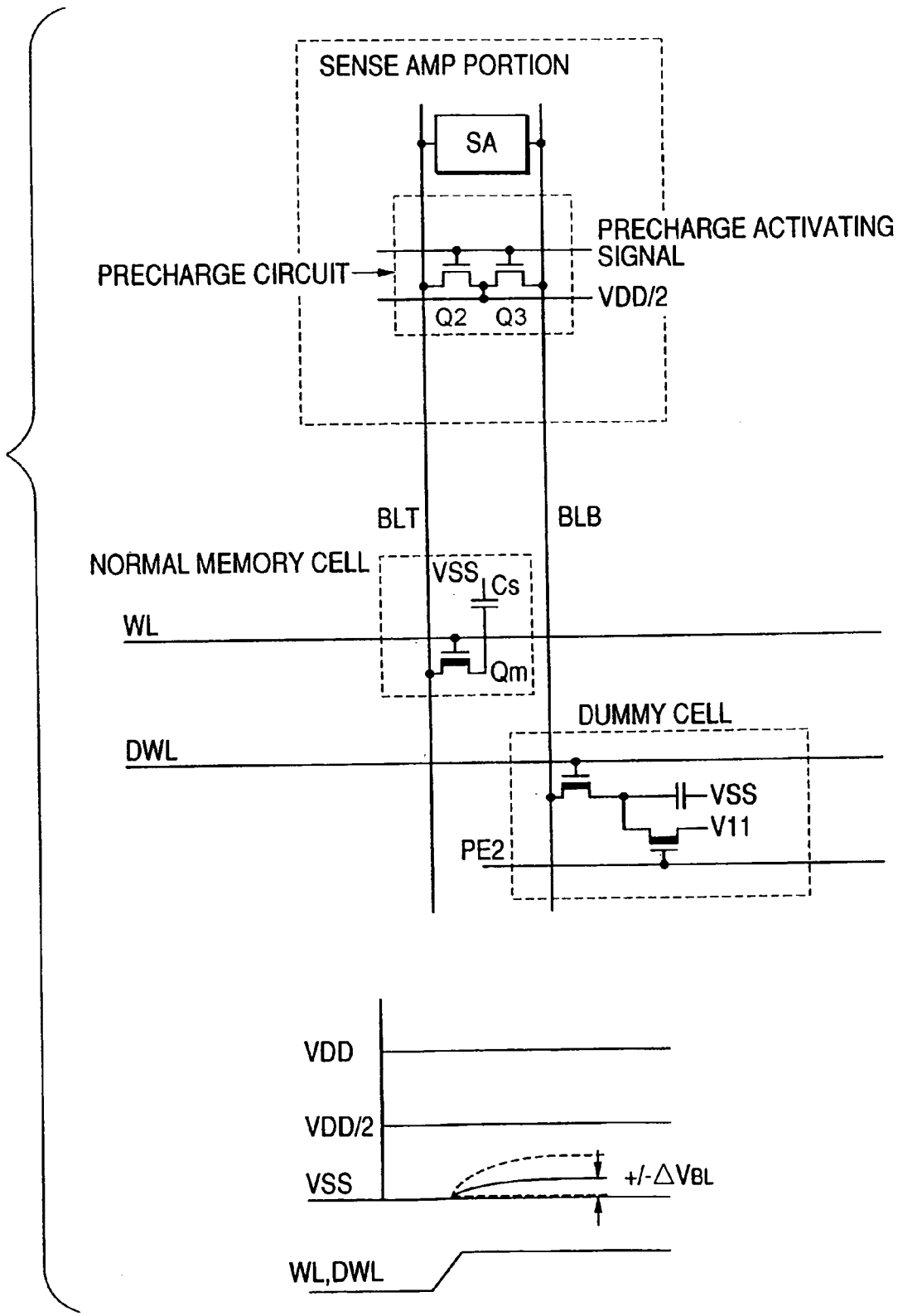
FIG. 2 is a schematic circuit diagram showing a DRAM adopting a VSS precharge method which was studied in the course of arriving at the present invention.

As shown in the drawing, the bit lines in the edge mats are folded back so that the bit-line-crossing number per one word line is halved. To read the same number of bits of the normal word lines using the redundancy word lines, two redundancy mats become necessary. Accordingly, the number of bits can be ensured by replacing one word line with two word lines on the redundancy mats provided at both ends thereof. It is also necessary to read the dummy cells to the bit lines formed on the redundancy mats and hence, the dummy cell word lines on the mats arranged close to the redundancy mats are activated. Accordingly, at the time of relieving as shown in FIG. 31B, 2 redundancy word lines and 2 dummy cell word lines, that is, 4 word lines in total are activated. Due to such a constitution, the present invention is also applicable to the DRAM of one crossing-point method memory cell by performing the above-mentioned operations.

Although the invention made by inventors of the present invention has been explained specifically based on the embodiments, the present invention is not limited to the above-mentioned embodiments and various modifications can be made without departing from the gist of the present invention. For example, the layout constitution of the memory array can adopt various embodiments. The present invention is widely used by DRAMs and the semiconductor integrated circuit devices which mount DRAMs thereon.

What is claimed is:

1. A semiconductor integrated circuit device having a memory circuit comprising:
a memory array including:
a plurality of word lines,
a first dummy word line,
a second dummy word line,
a plurality of bit lines across the plurality of word lines, the first dummy word line, and the second dummy word line,
a plurality of memory cells each having a first capacitor and a first MOSFET, a source and a drain of the first MOSFET being coupled between one of the plurality of bit lines and a storage node of the first capacitor, and a gate of the first MOSFET being coupled to one of the plurality of word lines, and
a plurality of dummy memory cells each having a second capacitor, a second MOSFET, and a third MOSFET, a source and a drain of the second MOSFET being coupled between one of the plurality of bit lines and a storage node of the second capacitor, a gate of the second MOSFET being coupled to the first dummy word line, a source and a drain of the third MOSFET being coupled between the storage node of the second capacitor and a reference voltage, and a gate of the third MOSFET being coupled to the second dummy word line;
a plurality of sense amplifiers each provided corresponding to one of the plurality of bit lines, sensing a difference between a signal read out from a selected memory cell and a signal read out from one of the plurality of dummy memory cells, and amplifying the signal read out from the selected memory cells to a first voltage or a second voltage; and
a precharge circuit supplying the first voltage to the plurality of bit lines,
wherein the reference voltage is between the first voltage and the second voltage.

2. A semiconductor integrated circuit device according to claim 1,
wherein the first dummy word line and the second dummy word line are formed at the same line pitch as the plurality of word lines.

3. A semiconductor integrated circuit device according to claim 2, further comprising:
a diffusion layer provided outside of the first and second dummy word line and supplied the reference voltage,
wherein one of the source or the drain of the third MOSFET is extended to the diffusion layer.

4. A semiconductor integrated circuit device according to claim 3,
wherein the diffusion layer is also a guard ring of the memory array.

5. A semiconductor integrated circuit device according to claim 1, further comprising:
a first selective circuit coupled to the first dummy word line; and a second selective circuit coupled to the second dummy word line, wherein the first and second selective circuits have a same circuit constitution as a word driver which is coupled to one of the plurality of word lines.

6. A semiconductor integrated circuit device according to claim 5, wherein the second dummy word line is set to a selective level to make the third MOSFET assume an ON state during a predetermined term within a precharge term of a precharge circuit supplying to the plurality of bit lines, and is set to a non-selective level in another term.

7. A semiconductor integrated circuit according to claim 6, wherein a channel length of MOSFETs included in the first and second selective circuits is larger than a channel length of MOSFETs included in the word driver.

8. A semiconductor integrated circuit according to claim 4, wherein a portion of the diffusion layer is formed into silicide.

9. A semiconductor integrated circuit according to claim 1, wherein the first capacitor is a stacked capacitor.

* * * * *